United States Patent
Bhattacharyya

(10) Patent No.: US 7,968,402 B2
(45) Date of Patent: Jun. 28, 2011

(54) METHOD FOR FORMING A HIGH-PERFORMANCE ONE-TRANSISTOR MEMORY CELL

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 1026 days.

(21) Appl. No.: 11/477,685

(22) Filed: Jun. 28, 2006

(65) Prior Publication Data
US 2006/0246653 A1    Nov. 2, 2006

Related U.S. Application Data

(62) Division of application No. 10/612,793, filed on Jul. 2, 2003.

(51) Int. Cl.
*H01L 21/8234* (2006.01)

(52) U.S. Cl. . 438/237; 438/257; 438/258; 257/E21.661; 257/E27.079; 257/E29.115; 365/105; 365/115; 365/243

(58) Field of Classification Search ............ 438/197, 438/237, 257, 258; 257/E21.646, E21.661, 257/E27.075, E27.084, E27.098, 107, 115, 257/E27.052, E27.079, E29.036, E29.037, 257/E29.047, E29.048, E29.115, E29.038, 257/E29.225, E29.337, E21.388, E21.389; 365/105, 115, 243

See application file for complete search history.

(56) References Cited

U.S. PATENT DOCUMENTS

| | | |
|---|---|---|
| 2,794,917 A | 6/1957 | Shockley |
| 2,899,646 A | 8/1959 | Read |
| 3,858,060 A | 12/1974 | Kenyon |
| 3,918,033 A * | 11/1975 | Case et al. ............ 365/180 |
| 3,964,085 A | 6/1976 | Kahng et al. |
| 3,978,577 A | 9/1976 | Bhattacharyya et al. |
| 4,068,217 A | 1/1978 | Arnett et al. |

(Continued)

FOREIGN PATENT DOCUMENTS

JP    61-166078    7/1986

OTHER PUBLICATIONS

Bauer, F, et al., "Design aspects of MOS controlled thyristor elements", *International Electron Devices Meeting 1989. Technical Digest*, (1989),297-300.

Bhattacharyya, A., "Physical & Electrical Characteristics of LPCVD Silicon Rich Nitride", *ECS Technical Digest, J. Electrochem. Soc.*, 131(11), 691 RDP, New Orleans,(1984),469C.

Carter, R J., "Electrical Characterization of High-k Materials Prepared By Atomic Layer CVD", *IWGI*, (2001),94-99.

Chang, H R., et al., "MOS trench gate field-controlled thyristor", *Technical Digest—International Electron Devices Meeting*, (1989),293-296.

(Continued)

*Primary Examiner* — Khiem D Nguyen
(74) *Attorney, Agent, or Firm* — Schwegman, Lundberg & Woessner, P.A.

(57) ABSTRACT

One aspect of this disclosure relates to a memory cell. In various embodiments, the memory cell includes an access transistor having a floating node, and a diode connected between the floating node and a diode reference potential line. The diode includes an anode, a cathode, and an intrinsic region between the anode and the cathode. A charge representative of a memory state of the memory cell is held across the intrinsic region of the diode. In various embodiments, the memory cell is implemented in bulk semiconductor technology. In various embodiments, the memory cell is implemented in semiconductor-on-insulator technology. In various embodiments, the diode is gate-controlled. In various embodiments, the diode is charge enhanced by an intentionally generated charge in a floating body of an SOI access transistor. Various embodiments include laterally-oriented diodes (stacked and planar configurations), and various embodiments include vertically-oriented diodes. Other aspects and embodiments are provided herein.

24 Claims, 23 Drawing Sheets

U.S. PATENT DOCUMENTS

| | | | |
|---|---|---|---|
| 4,488,262 | A | 12/1984 | Basire et al. |
| 4,692,785 | A | 9/1987 | Wada |
| 4,754,310 | A | 6/1988 | Coe |
| 4,791,604 | A | 12/1988 | Lienau et al. |
| 4,829,482 | A | 5/1989 | Owen |
| 4,870,470 | A | 9/1989 | Bass, Jr. et al. |
| 5,043,946 | A | 8/1991 | Yamauchi et al. |
| 5,382,814 | A | 1/1995 | Ashley et al. |
| 5,396,454 | A | 3/1995 | Nowak |
| 5,488,243 | A | 1/1996 | Tsuruta et al. |
| 5,557,569 | A | 9/1996 | Smayling et al. |
| 5,621,683 | A | 4/1997 | Young |
| 5,627,779 | A | 5/1997 | Odake et al. |
| 5,684,737 | A * | 11/1997 | Wang et al. ............ 365/175 |
| 5,686,739 | A | 11/1997 | Baba |
| 5,801,993 | A | 9/1998 | Choi |
| 5,814,853 | A | 9/1998 | Chen |
| 5,896,313 | A * | 4/1999 | Kao et al. ............... 365/177 |
| 5,963,476 | A | 10/1999 | Hung et al. |
| 5,981,335 | A | 11/1999 | Chi |
| 6,049,109 | A | 4/2000 | Omura et al. |
| 6,104,045 | A | 8/2000 | Forbes et al. |
| 6,118,152 | A | 9/2000 | Yamaguchi et al. |
| 6,184,539 | B1 | 2/2001 | Wu et al. |
| 6,201,734 | B1 | 3/2001 | Sansbury et al. |
| 6,229,161 | B1 * | 5/2001 | Nemati et al. ............ 257/133 |
| 6,243,296 | B1 | 6/2001 | Sansbury |
| 6,248,626 | B1 | 6/2001 | Kumar et al. |
| 6,291,832 | B1 * | 9/2001 | Krivokapic ............... 257/25 |
| 6,294,412 | B1 | 9/2001 | Krivokapic |
| 6,294,427 | B1 | 9/2001 | Furuhata et al. |
| 6,366,501 | B1 | 4/2002 | Thurgate et al. |
| 6,462,359 | B1 | 10/2002 | Nemati et al. |
| 6,545,297 | B1 | 4/2003 | Noble et al. |
| 6,574,143 | B2 | 6/2003 | Nakazato |
| 6,600,188 | B1 | 7/2003 | Jiang et al. |
| 6,611,452 | B1 | 8/2003 | Han |
| 6,617,651 | B2 | 9/2003 | Ohsawa |
| 6,638,627 | B2 | 10/2003 | Potter |
| 6,653,174 | B1 | 11/2003 | Cho et al. |
| 6,653,175 | B1 | 11/2003 | Nemati et al. |
| 6,653,665 | B2 * | 11/2003 | Kajiyama ............... 257/133 |
| 6,660,616 | B2 | 12/2003 | Babcock et al. |
| 6,661,042 | B2 | 12/2003 | Hsu |
| 6,812,504 | B2 | 11/2004 | Bhattacharyya |
| 6,845,034 | B2 | 1/2005 | Bhattacharyya |
| 6,881,994 | B2 | 4/2005 | Lee et al. |
| 6,888,200 | B2 | 5/2005 | Bhattacharyya |
| 6,903,969 | B2 | 6/2005 | Bhattacharyya |
| 6,917,078 | B2 | 7/2005 | Bhattacharyya |
| 6,965,129 | B1 | 11/2005 | Horch et al. |
| 7,031,182 | B2 | 4/2006 | Beigel et al. |
| 7,042,027 | B2 * | 5/2006 | Bhattacharyya ............ 257/146 |
| 7,145,186 | B2 | 12/2006 | Bhattacharyya |
| 7,184,312 | B2 | 2/2007 | Bhattacharyya |
| 7,245,535 | B2 | 7/2007 | McCollum et al. |
| 7,291,519 | B2 | 11/2007 | Bhattacharyya |
| 7,339,830 | B2 | 3/2008 | Bhattacharyya |
| 7,440,310 | B2 | 10/2008 | Bhattacharyya |
| 7,440,317 | B2 | 10/2008 | Bhattacharyya |
| 7,456,054 | B2 | 11/2008 | Bhattacharyya |
| 2002/0048190 | A1 | 4/2002 | King |
| 2002/0105023 | A1 | 8/2002 | Kuo et al. |
| 2003/0042534 | A1 | 3/2003 | Bhattacharyya et al. |
| 2003/0072126 | A1 | 4/2003 | Bhattacharyya |
| 2003/0080370 | A1 | 5/2003 | Harari et al. |
| 2003/0089942 | A1 | 5/2003 | Bhattacharyya |
| 2003/0151948 | A1 | 8/2003 | Bhattacharyya et al. |
| 2003/0160277 | A1 | 8/2003 | Bhattacharyya et al. |
| 2004/0007734 | A1 | 1/2004 | Kato et al. |
| 2004/0014304 | A1 | 1/2004 | Bhattacharyya |
| 2004/0026728 | A1 | 2/2004 | Yoshida et al. |
| 2004/0041206 | A1 | 3/2004 | Bhattacharyya |
| 2004/0155317 | A1 | 8/2004 | Bhattacharyya |
| 2004/0246764 | A1 | 12/2004 | King |
| 2005/0001232 | A1 | 1/2005 | Bhattacharyya |
| 2005/0012119 | A1 | 1/2005 | Herner et al. |
| 2005/0026353 | A1 | 2/2005 | Bhattacharyya |
| 2005/0026354 | A1 | 2/2005 | Bhattacharyya |
| 2005/0047251 | A1 | 3/2005 | Bhattacharyya |
| 2005/0098800 | A1 | 5/2005 | Herner et al. |
| 2005/0099839 | A1 | 5/2005 | Bhattacharyya |
| 2005/0247962 | A1 | 11/2005 | Bhattacharyya |
| 2005/0250261 | A1 | 11/2005 | Bhattacharyya |
| 2005/0263763 | A1 | 12/2005 | Bhattacharyya |
| 2005/0269628 | A1 | 12/2005 | King |
| 2005/0280023 | A1 | 12/2005 | Bhattacharyya |
| 2006/0043411 | A1 | 3/2006 | Bhattacharyya |
| 2006/0227601 | A1 | 10/2006 | Bhattacharyya |
| 2006/0244007 | A1 | 11/2006 | Bhattacharyya |
| 2006/0245244 | A1 | 11/2006 | Bhattacharyya |
| 2007/0138555 | A1 | 6/2007 | Bhattacharyya |

OTHER PUBLICATIONS

Choi, J D., et al., "A 0.15 um NAND Flash Technology With 0.11 um2 Cell Size For 1 Gbit Flash Memory", *IEDM Technical Digest*, (2000),767-770.

Fazan, P, et al., "Capacitor-Less 1-Transistor DRAM", *IEEE International SOI Conference*, (2002),10-13.

Frohman-Bentchkowsky, D, "An integrated metal-nitride-oxide-silicon (MNOS) memory", *Proceedings of the IEEE*, 57(6), (Jun. 1969),1190-1192.

Han, Kwangseok, "Characteristics of P-Channel Si Nano-Crystal Memory", *IEDM Technical Digest, International Electron Devices Meeting*, (Dec. 10-13, 2000),309-312.

Jagar, S, "Single grain thin-film-transistor (TFT) with SOI CMOS performance formed by metal-induced-lateral-crystallization", *International Electron Devices Meeting 1999. Technical Digest*, (1999),293-6.

Kumar, M. J., "Lateral Schottky Rectifiers for Power Integrated Circuits", *International Workshop on the Physics of Semiconductor Devices*,11th, 4746, Allied Publishers Ltd., New Delhi, India,(2002),414-421.

Lai, S K., et al., "Comparison and trends in Today's dominant E2 Technologies", *IEDM Technical Digest*, (1986),580-583.

Nemati, F, et al., "A novel high density, low voltage SRAM cell with a vertical NDR device", *1998 Symposium on VLSI Technology Digest of Technical Papers*, (1998),66-7.

Nemati, F, et al., "A novel thyristor-based SRAM cell (T-RAM) for high-speed, low-voltage, giga-scale memories", *International Electron Devices Meeting 1999. Technical Digest*, (1999),283-6.

Ohsawa, Takashi, et al., "Memory design using one-transistor gain cell on SOI", *IEEE International Solid-State Circuits Conference. Digest of Technical Papers*, vol. 1, (2002),452-455.

Okhonin, S., et al., "A SOI capacitor-less 1T-DRAM concept", *2001 IEEE International SOI Conference. Proceedings, IEEE. 2001*, (2000),153-154.

Shihone, T, et al., "Ultra-high di/dt 2500 V MOS assisted gate-triggered thyristors (MAGTs) for high repetition excimer laser system", *International Electron Devices Meeting 1989. Technical Digest*, (1989),301-4.

Sze, S. M., "Table 3: Measured Schottky Barrier Heights", *In; Physics of Semiconductor Devices*, John Wiley & Sons, Inc.,(1981),p. 291.

Tiwari, Sandip, et al., "Volatile and Non-Volatile Memories in Silicon with Nano-Crystal Storage", *Int'l Electron Devices Meeting: Technical Digest*, Washington, DC,(Dec. 1995),521-524.

Van Meer, H, "Ultra-thin film-depleted SOI CMOS with raised G/S/D device architecture for sub-100 nm applications", *2001 IEEE International SOI Conference*, (2001),45-6.

Zhang, H., "Atomic Layer Deposition of High Dielectric Constant Nanolaminates", *Journal of The Electrochemical Society*, 148(4), (Apr. 2001),F63-F66.

Lee, S. W, et al., "Low Temperature Poly-Si Thin Film Transistor Fabrication by Metal-Induced Lateral Crystallization", *IEEE Electron Device Letters*, (Apr. 1996), 160-162.

* cited by examiner

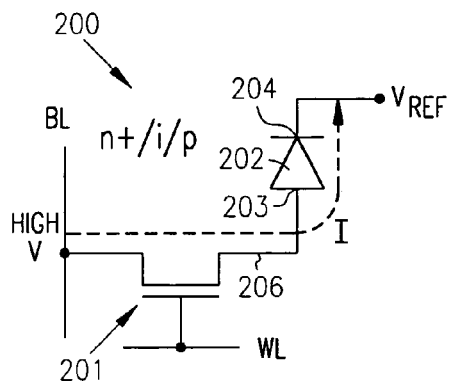
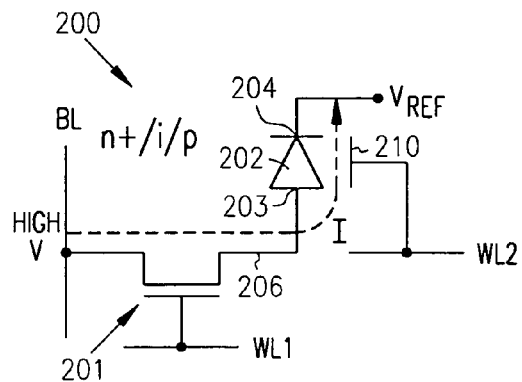
FIG. 2A  FIG. 2B
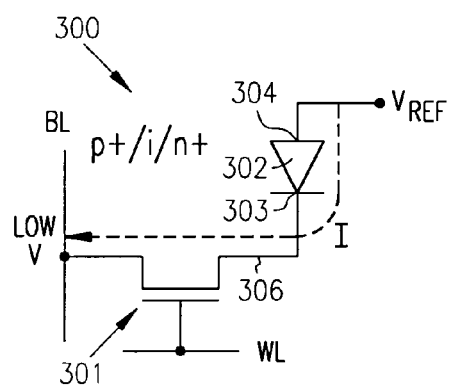
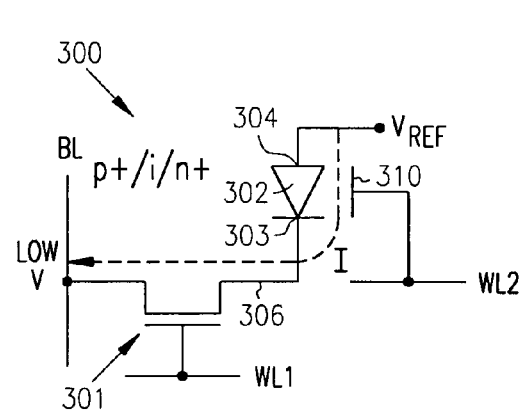
FIG. 3A  FIG. 3B

METHOD FOR FORMING A HIGH-PERFORMANCE ONE-TRANSISTOR MEMORY CELL

CROSS REFERENCE TO RELATED APPLICATIONS

This application is a divisional application of U.S. patent application Ser. No. 10/612,793, filed Jul. 2, 2003, which is related to the following commonly assigned U.S. patent applications all of which are herein incorporated by reference in their entirety:
"Gated Lateral Thyristor-Based Random Access Memory Cell (GLTRAM)," U.S. application Ser. No. 10/232,855, filed on Aug. 30, 2002; and "One Transistor SOI Non-Volatile Random Access Memory Cell," U.S. application Ser. No. 10/232,846, filed on Aug. 30, 2002.

TECHNICAL FIELD

This disclosure relates generally to integrated circuits, and more particularly, to high-performance one-transistor memory cells.

BACKGROUND

Integrated circuit memory includes dynamic random access memory (DRAM) and static random access memory (SRAM). A goal of DRAM cell design is to achieve high density with a cell density of $8F^2$, where F is the minimum printable feature size. DRAM cells provide good memory density, but are relatively slow. A minimum value of capacitance per cell is required to sense conventional DRAM cells. Thus, the capacitor poses a scalability challenge for DRAM cells for every forthcoming generation of reduced feature size F. The capacitor structure has become three-dimensional and complex, which adversely impacts fabrication and yield. A goal of SRAM cell design is high performance. SRAM cells are faster than DRAM cells, but the required area for SRAM cells is large. Six-transistor and four-transistor memory cells have a cell density range from about $50 F^2$ to about $100 F^2$.

Negative Differential Resistance (NDR) devices have been used to reduce the number of elements per memory cell. However, NDR devices tend to suffer from problems such as high standby power consumption, high operating voltages, low speeds and complicated fabrication processes.

F. Nemati and J. D. Plummer have disclosed a two-device thyristor-based SRAM cell (TRAM) that includes an access transistor and a gate-assisted, vertical thyristor. The disclosed vertical p+/n/p/n+ thyristor is operated in a gate-enhanced switching mode to provide the memory cell with SRAM-like performance and DRAM-like density. The performance of the TRAM cell depends on the turn-off characteristics of the vertical thyristor, and the turn-off characteristics depend on the stored charge and carrier transit time in the p-region of the p+/n/p/n+ thyristor. The turn-off characteristics for the vertical thyristor is improved from milliseconds to five nanoseconds by reverse biasing the thyristor for a write-zero operation and by using a gate to assist with discharging the stored charge to turn off the thyristor. Even so, the geometry and vertical height of the vertical thyristor's p-region limits the turn-off characteristics and the associated cell performance of the gate-assisted, vertical thyristor disclosed by Nemati and Plummer. The scalability of the TRAM cell and the ability to control the performance of the TRAM cell are also limited.

S. Okhonin et al. has proposed a SOI capacitor-less single-transistor DRAM cell that uses the state of the floating body charge to control the channel conductance of the transistor and define the memory state ("1" or "0"). DRAM-like operations were demonstrated using a number of methods to generate carriers in the floating body. However, the stored charge retention time (memory retention) in the proposed cell is sensitive to the device channel length and decreases with decreasing channel length. Additionally, the memory retention in the proposed cell is fundamentally dependent on the recombination time constants, and multiple mechanisms of recombination could be simultaneously operative. Thus, the memory retention for the proposed cell is expected to be both temperature and process sensitive. Therefore, a serious concern is the ability to control memory retention.

There is a need in the art to provide improved memory cells.

BRIEF DESCRIPTION OF THE DRAWINGS

FIGS. 2A-2B are schematic illustrations of the memory cells of FIGS. 1A-1B, respectively, where the memory cells include an n-channel access transistor and a n+/i/p diode connected to a floating node of the access transistor, according to various embodiments of the present invention.

FIGS. 3A-3B are schematic illustrations of the memory cells of FIGS. 1A-1B, respectively, where the memory cells include an n-channel access transistor and a p+/i/n+ diode connected to a floating node of the access transistor, according to various embodiments of the present invention.

DETAILED DESCRIPTION

Figure 1A:
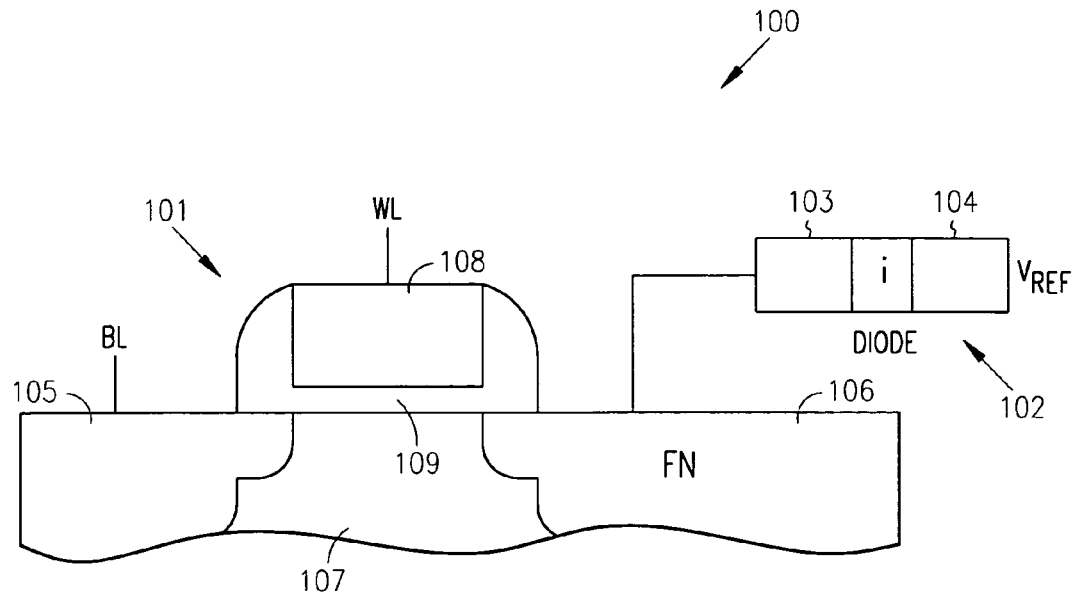
FIGS. 1A-1B illustrate memory cells that include an access transistor and a diode, with an intrinsic region, connected to a floating node of the access transistor, according to various embodiments of the present invention, where the diode in FIG. 1A is not gate-controlled and the diode in FIG. 1B is gate-controlled.

The following detailed description refers to the accompanying drawings which show, by way of illustration, specific aspects and embodiments in which the present invention may be practiced. The various embodiments are not necessarily mutually exclusive as aspects of one embodiment can be combined with aspects of another embodiment. Other embodiments may be utilized and structural, logical, and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The terms "horizontal" and "vertical", as well as prepositions such as "on", "over" and "under" are used in relation to the conventional plane or surface of a wafer or substrate, regardless of the orientation of the wafer or substrate. References to "an", "one", or "various" embodiments in this disclosure are not necessarily to the same embodiment, and such references contemplate more than one embodiment. The following detailed description is, therefore, not to be taken in a limiting sense, and the scope of the present invention is defined only by the appended claims, along with the full scope of equivalents to which such claims are entitled.

This application discusses improved memory cells fabricated without integrated capacitors. These memory cells provide DRAM-like density, faster SRAM-like performance, and improved scalability. Various aspects of the present invention relate to high-density and high-performance memory devices that bridge the application requirements for DRAM and SRAM. The memory cells include a single transistor having a floating node and an integrated diode with an intrinsic region (e.g. p/i/n or n/i/p diode). The intrinsic region of the diode holds the memory state, and thus can be used to replace complex capacitor fabrication of the conventional DRAM device. Various embodiments are implemented in bulk silicon technology, and various embodiments are implemented in semiconductor-on-insulator or silicon-on-insulator (SOI) technology. Various embodiments gate the integrated diode to enhance speed and reduce standby power for the memory cell. Gate-controlled integrated diodes are particularly useful for the bulk implementations. SOI implementations use floating body charges to enhance operation and performance such that, in various embodiments, the SOI memory cell includes a diode without gate control. Various embodiments include laterally-oriented diodes, and various embodiments include vertically-oriented diodes.

One aspect of this disclosure relates to a memory cell. In various embodiments, the memory cell includes an access transistor having a floating node, and a diode connected between the floating node and a diode reference potential line. The diode includes an anode, a cathode, and an intrinsic region between the anode and the cathode. The intrinsic region holds the potential of the floating node and thereby the memory state of the memory cell. Other aspects and embodiments are provided herein.

Aspects of the present invention form a memory cell by electrically connecting a diode having an intrinsic region between an anode region and a cathode region (e.g. p/i/n and n/i/p diodes) to a floating node of an access transistor. In various embodiments, the diode is integrally formed with the floating node of the access transistor. The intrinsic region of the diode stores the charge-state of the memory cell. Thus, the complex processing techniques associated with forming a capacitor in a DRAM memory cell are avoided. The various memory cell embodiments disclosed below all feature one-transistor cell design, with $8F^2$ cell density and SRAM-like performance.

The p/i/n or n/i/p diode functions as a Negative Differential Resistance (NDR) device. One example of an NDR device is the thyristor for the TRAM cell disclosed by Nemati and Plummer. Another example of an NDR device is the thyristor for the Gated Lateral Thyristor-Based Random Access Memory (GLTRAM) disclosed in U.S. application Ser. No. 10/232,855, filed on Aug. 30, 2002 and assigned to Applicant's assignee, which is herein incorporated by reference in its entirety. These diodes have an anode, a cathode, and an intrinsic region formed there between, and further have forward turn-on characteristics similar to that of thyristors because of the NDR behavior attributed to the intrinsic (undoped) region of the diode. Characteristics of a NDR device are illustrated and discussed with respect to FIGS. 1C-1D. The intrinsic diode region normally functions as a pseudo-dielectric that is capable of holding an appropriate potential in the floating node and thereby the memory state of the device.

When the diodes are in the "on" state in bulk implementations, they have a relatively high holding current and a relatively slow turn-off due to the saturation of the junctions if the diodes are not gate-controlled. Thus, without modification, these diodes implemented in bulk semiconductor technology have a relatively low performance due to slow turn-off characteristics and a relatively high standby power due to high leakage. According to various embodiments of the present invention, the diode is gate-controlled to achieve fast turn-off and thereby SRAM-like functionality and high performance and to further achieve low standby power similar to TRAM or GLTRAM devices. These memory cells with a gate-controlled diode are referred to herein as a gate-controlled diode random access memory (GCD-RAM) cells. As will be described below, various GCD-RAM cell embodiment include vertical gate-controlled diodes (VGCD-RAM cells), and various GCD-RAM cell embodiments include lateral gate-controlled diodes (LGCD-RAM cells). Various embodiments implement GCD-RAM cells in SOI technology.

In semiconductor-on-insulator (SOI) implementations such as silicon-on-insulator implementations, the charges generated in the floating body of the access transistor enhance the diode performance to acceptable levels. These memory cells with charge-enhanced diode performance are referred to herein as a charge-enhanced diode random access memory (CED-RAM) cells. Various embodiments of the CED-RAM cells implement gate control to further enhance the diode performance. However, the performance of CED-RAM cells without gate-controlled diodes is sufficient for many applications. CED-RAM cells without gate-controlled diodes are simpler to fabricate and denser than CED-RAM cells with gate-controlled diodes.

Figure 1B:
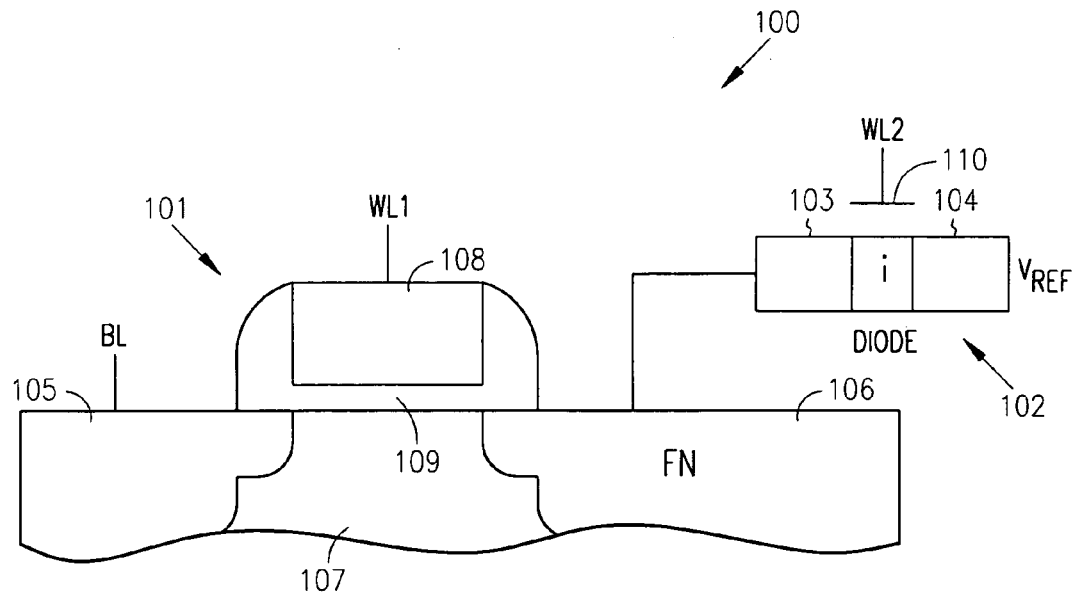

FIGS. 1A-1B illustrate memory cells that include an access transistor and a diode, with an intrinsic region, connected to a floating node of the access transistor, according to various embodiments of the present invention, where the diode in FIG. 1A is not gate-controlled and the diode in FIG. 1B is gate-controlled.

The illustrated structure 100 generally includes an access transistor 101 and a diode 102. The diode includes a first region (e.g. cathode) 103, a second region (e.g. anode) 104, and a intrinsic region denoted by the nomenclature "i" between the first and second regions. The label "cathode" and "anode" depends on the polarity of a voltage placed across the diode. Various embodiments include an n/i/p diode where the n region functions as an anode and the p region functions as the cathode, and various embodiments include a p/i/n diode where the p region functions as an anode and the n region functions as cathode. The transistor 101 includes a first node 105, (also referred to herein as a first diffusion region or first source/drain region), a second node 106 (also referred to herein as a second diffusion region or second source/drain region), and a body region 107. The transistor 101 further includes a gate 108 separated from the body region 107 by a gate insulator 109. The illustrated structure represents embodiments implemented in bulk semiconductor technology, and embodiments implemented in SOI technology (including partially-depleted and fully-depleted devices). Furthermore, according to various embodiments, the access transistor forms a p-channel device, and according to various embodiments, the access transistor forms an n-channel device.

A word line (WL or WL1) is connected to the gate 108 of the access transistor, and a bit line (BL) is connected to the first node 105 of the access transistor. The second node 106 forms a floating node. The diode is connected between a reference potential and the floating node. The intrinsic region in the diode is capable of holding a charge and associated potential at the floating node, and thus is capable of providing the state of the memory cell. The diode is connected in series with the pass transistor at the floating node, thereby establishing electrical connection between the anode node $V_{REF}$ and the bit line node of the pass transistor. The connections to the bit line, to the word line, to the reference potential, and between the diode and the floating node are not intended to illustrate any particular structure, but rather are intended to schematically illustrate aspects of the present invention illustrated by the various embodiments discussed below.

According to various embodiments, a diode gate 110 is gate-controlled by a second word line (WL2) to assist not only in the forward turn-on to a high conduction state, but also in the transition between an "on" state (characterized by a high holding current and saturated junctions when the diode is conducting in a forward mode), and an "off" state. The gate control improves the speed of charge recombination in the intrinsic region of the diode, and thus improves cell performance. The gate-controlled diode is particularly beneficial where the thermal charge recombination is inherently slow, such as in bulk semiconductor implementations. The gate improves the discharge speed, which corresponds an improved write speed from a memory state "1" (high conduction state) to a memory state "0" (low conduction state). Gate-control improves the write speed by at least an order of magnitude. However, the gate control adversely affects density and complicates fabrication. Thus, the gate-controlled diode is included in the memory cell design based on the needs of the memory application.

Figure 1C:
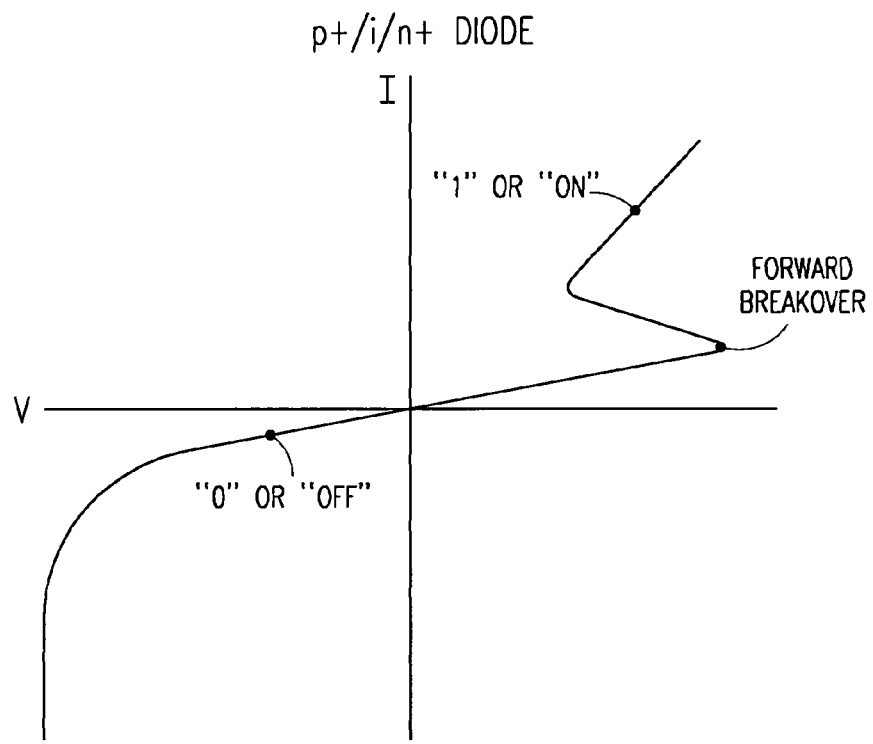
FIGS. 1C-1D illustrate I-V representative curves for p+/i/n+ and n+/i/p+ diodes, respectively, for the memory cells of FIGS. 1A-1B.
Figure 1D:
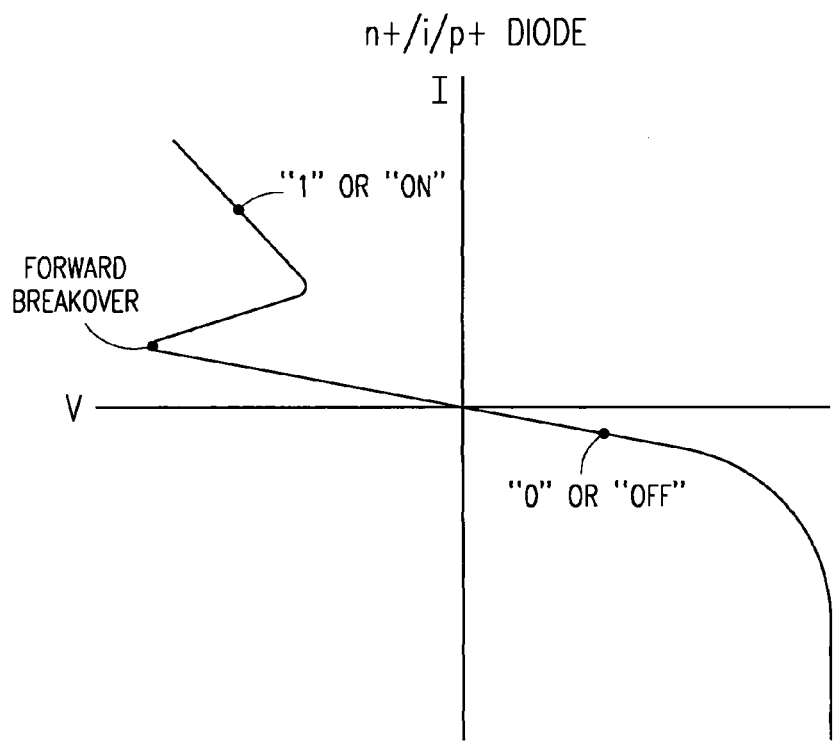

FIGS. 1C-1D illustrate I-V representative curves for p+/i/n+ and n+/i/p+ diodes, respectively, for the memory cells of FIGS. 1A-1B. The curves for these diodes represent a forward breakover point. Thus, when forward biased beyond the forward breakover voltage, the diode is able to conduct at a higher current level at low voltage due to the NDR effect. This high current low voltage state of the diode is used to provide the "ON" or "one" memory state for the memory cell. On the other hand, when the diode is reverse biased into the relatively high voltage low current state, such diode state is used to provide an "OFF" or "zero" memory state.

FIGS. 2A, 3A, 4A and 5A are schematic illustrations for various embodiments of the memory cell that includes a diode without gate-control, as illustrated in FIG. 1A. FIGS. 2B, 3B, 4B and 5B are schematic illustrations for various embodiments of the memory cell that includes a gate-controlled diode, as illustrated in FIG. 1B. As illustrated in the figures, various embodiments include an n-channel access transistor, a p-channel access transistor, an n/i/p diode without gate-control, an n/i/p diode with gate-control, a p/i/n diode without gate-control, a p/i/n diode with gate-control, and various combinations thereof. As used herein, n/i/p diodes include diodes having an n-type anode and a p-type cathode, and p/i/n diodes include diodes having a p-type anode and an n-type cathode. The doping concentrations for these n-type and p-type regions can vary for a desired application.

FIGS. 2A-2B are schematic illustrations of the memory cells of FIGS. 1A-1B, respectively, where the memory cells 200 include an n-channel access transistor 201 and a n+/i/p diode 202 connected to a floating node 206 of the access transistor, according to various embodiments of the present invention. In the illustrated memory cell 200, the n+ anode 204 of the diode 202 is connected to the reference voltage potential, and the p-type cathode 203 is connected to the floating n-type diffusion region 206 of the access transistor 201. FIG. 2A illustrates a memory cell 200 that includes a diode 202 without gate control, such as is discussed below with respect to a CED-RAM cell implemented in SOI technology. FIG. 2B illustrates a memory cell 200 that includes a diode 202 with gate control via a diode gate 210/second word line (WL2), such as is discussed below with respect to a GCD-RAM cell implemented in bulk semiconductor technology.

FIGS. 2A-2B also illustrate a read one operation where both the transistor 201 and the diode 202 are conducting. The bit line potential is high, and the illustrated current I flows from the bit line through the transistor 201 and diode 202 to the reference line during the read one operation. The current corresponds to electrons flowing through the n+/i/p diode through the transistor to the bit line. This current is sensed by monitoring the bit line potential.

FIGS. 3A-3B are schematic illustrations of the memory cells of FIGS. 1A-1B, respectively, where the memory cells 300 include an n-channel access transistor 301 and a p+/i/n+ diode 302 connected to a floating node 306 of the access transistor, according to various embodiments of the present invention. In the illustrated memory cell 300, the p+ anode 304 of the diode 302 is connected to the diode reference voltage potential, and the n-type cathode 303 is connected to or formed with the floating n-type diffusion region 306 of the access transistor. FIG. 3A illustrates a memory cell that includes a diode without gate control, such as is discussed below with respect to a CED-RAM cell implemented in SOI technology. FIG. 3B illustrates a memory cell that includes a diode with gate control via a diode gate 310/second word line (WL2), such as is discussed below with respect to a GCD-RAM cell implemented in bulk semiconductor technology.

FIGS. 3A-3B also illustrate a read one operation where both the transistor 301 and the diode 302 are conducting. The bit line potential is low, and the illustrated current I flows from the reference line through the diode 302 and the transistor 301 to the bit line during the read one operation. The current corresponds to holes flowing through the p+/i/n+ diode through the transistor to the bit line. This current is sensed by monitoring the bit line potential.

Electrons are the majority carrier in the n+/i/p diode illustrated in FIGS. 2A-2B, and holes are the majority carrier in the p+/i/n+ diode illustrated in FIGS. 3A-3B. Electrons are more mobile than holes, thus the n+/i/p diodes functions as a faster switch than the p+/i/n diode. However, the fabrication process for forming the p- type cathode of the n+/i/p diode to contact an n+floating node region of the n-channel access transistor is more complicated than the fabrication process for forming the n+ type cathode of p+/i/n+ to contact an n+ floating node region of the n-channel access transistor.

Figure 4A:
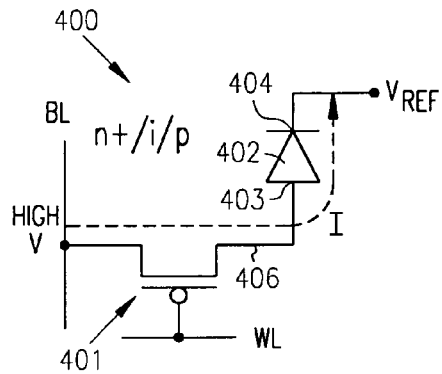
FIGS. 4A-4B are schematic illustrations of the memory cells of FIGS. 1A-1B, respectively, where the memory cells include a p-channel access transistor and a n+/i/p diode connected to a floating node of the access transistor, according to various embodiments of the present invention.
Figure 4B:
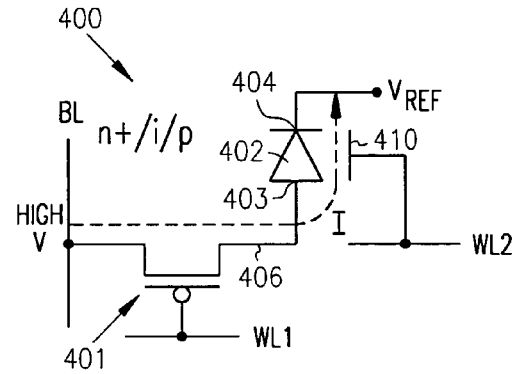

FIGS. 4A-4B are schematic illustrations of the memory cells of FIGS. 1A-1B, respectively, where the memory cells 400 include a p-channel access transistor 401 and a n+/i/p diode 402 connected to a floating node 406 of the access transistor, according to various embodiments of the present invention. In the illustrated memory cell 400, the n+ anode 404 of the diode 402 is connected to the reference voltage potential, and the p-type cathode 403 is connected to the floating p-type diffusion region 406 of the access transistor 401. FIG. 4A illustrates a memory cell that includes a diode without gate control, such as is discussed below with respect to a CED-RAM cell implemented in SOI technology. FIG. 4B illustrates a memory cell that includes a diode with gate control via a diode gate 410/second word line (WL2), such as is discussed below with respect to a GCD-RAM cell with an n-channel device implemented in bulk semiconductor technology.

FIGS. 4A-4B also illustrate a read one operation where both the transistor 401 and the diode 402 are conducting. The bit line potential is high, and the illustrated current I flows from the bit line through the transistor 401 and diode 402 to the reference line during the read one operation. The current corresponds to electrons flowing through the n+/i/p diode through the transistor to the bit line. This current is sensed by monitoring the bit line potential.

Figure 5A:
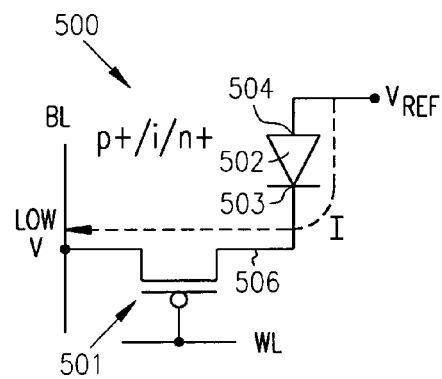
FIGS. 5A-5B are schematic illustrations of the memory cells of FIGS. 1A-1B, respectively, where the memory cells include a p-channel access transistor and a p+/i/n+ diode connected to a floating node of the access transistor, according to various embodiments of the present invention.
Figure 5B:
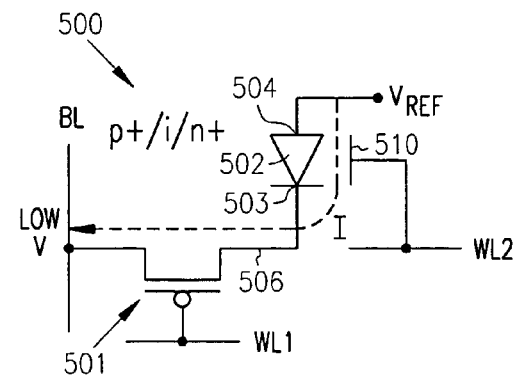

FIGS. 5A-5B are schematic illustrations of the memory cells of FIGS. 1A-1B, respectively, where the memory cells 500 include a p-channel access transistor 501 and a p+/i/n+ diode 502 connected to a floating node 506 of the access transistor, according to various embodiments of the present invention. In the illustrated memory cell, the p+ anode 504 of the diode 502 is connected to the reference voltage potential, and the n+ cathode 503 is connected to the floating p− type diffusion region 506 of the access transistor 501. FIG. 5A illustrates a memory cell that includes a diode without gate control, such as is discussed below with respect to a CED-RAM cell implemented in SOI technology. FIG. 5B illustrates a memory cell that includes a diode with gate control via a diode gate 510/second word line (WL2), such as is discussed below with respect to a GCD-RAM cell with an n-channel device implemented in bulk semiconductor technology.

FIGS. 5A-5B also illustrate a read one operation where both the transistor 501 and the diode 502 are conducting. The bit line potential is low, and the illustrated current I flows from the reference line through the diode 502 and the transistor 501 to the bit line during the read one operation. The current corresponds to holes flowing through the p+/i/n+ diode through the transistor to the bit line. This current is sensed by monitoring the bit line potential.

Electrons are the majority carrier in n-channel access transistors, and holes are the majority carrier in p-channel access transistors. Therefore, n-channel access transistors switch faster than p-channel access transistors due to the higher mobility of electrons. For the sake of brevity, the memory cell embodiments discussed in detail below include n-channel access transistors such as have been illustrated with respect to FIGS. 2A-2B and 3A-3B. However, p-channel versions of these illustrated memory cell embodiments are encompassed by this disclosure.

A number of embodiments are discussed below. Embodiments implemented in bulk semiconductor technology are discussed first, followed by embodiments implemented in SOI technology.

The illustrated memory cell embodiments implemented in bulk semiconductor technology include gate-controlled diodes. It is understood that various embodiments of the device can be implemented with diodes that are not gate-controlled. Although diodes without gate-control are simpler to fabricate than diodes with gate-control, a resulting performance of a memory device implemented in bulk semiconductor technology without a gate-controlled diode is less than the performance of a memory device implemented in bulk semiconductor technology with a gate-controlled diode because of the characteristically slow turn-off attributable to the saturations of the junction in the "on" state. Memory cells with gate-controlled diodes are referred to herein as a gate-controlled diode random access memory (GCD-RAM) cell. The illustrated GCD-RAM cells discussed below are implemented in bulk semiconductor technology such as bulk silicon technology. However, various memory cell embodiments that include gate-controlled diodes are implemented in SOI technology, and various memory cell embodiments implemented in bulk semiconductor technology include diodes that are not gate-controlled.

The illustrated memory cell embodiments implemented in SOI technology include diodes without gate-control. It is understood that various embodiments of the SOI memory device can be implemented with diodes that are gate-controlled. However, diodes without gate-control are simpler to fabricate than diodes with gate-control. The performance of memory cells implemented in SOI technology is sufficient without gate-controlled diodes. Memory cells implemented in SOI technology are referred to herein as a charge-enhanced diode random access memory (CED-RAM) cell. The illustrated CED-RAM cell includes a diode that is not gate-controlled. However, various memory cell embodiments implemented in SOI technology include gate-controlled diodes, and various memory cell embodiments implemented in bulk semiconductor technology include diodes that are not gate-controlled.

The embodiments illustrated below include vertical diode structures and lateral diode structures. Lateral diode structure embodiments include planar configurations and stacked configurations. The stacked configuration is denser but requires more complex fabrication steps. The lateral embodiments discussed here is not intended to illustrate all lateral option, but rather are included as a non-exclusive example. In general, lateral diode structures are more easily and more accurately fabricated than vertical diode structures. The geometry of the intrinsic diode region can affect the performance of the memory cell. Accurate formation of the diode provides an intrinsic diode region with a precise geometry to provide an accurate and predictable charge storage and charge recombination. However, memory cells fabricated with vertical diode structures are capable of having a denser design than memory cells fabricated with lateral diode structures. Thus, the decision between lateral and vertical diode structures is a design question that weighs these competing interests for a particular application.

In order to aid a reader of this disclosure in navigating through the remainder of this disclosure, a general outline is provided in Table 1. The language of the headings should not be taken to limit the present subject matter.

TABLE 1

GENERAL OUTLINE OF EMBODIMENTS ILLUSTRATED BELOW

A. Gate-Controlled Diode Random Access Memory (GCD-RAM)
   Implemented in Bulk Semiconductor Technology
    1. GCD-RAM With N/I/P Diode
      (a) VGCD-RAM With Integrated N/I/P Diode
      (b) LGCD-RAM With Integrated N/I/P Diode
      (c) Operation Of GCD-RAM With N/I/P Diode
    2. GCD-RAM With P/I/N Diode
      (a) VGCD-RAM With Integrated P/I/N Diode
      (b) LGCD-RAM With Integrated P/I/N Diode
      (c) Operation Of GCD-RAM With P/I/N Diode
    3. GCD-RAM Process
      (a) VGCD-RAM Process
      (b) LGCD-RAM Process TABLE 1-continued

GENERAL OUTLINE OF EMBODIMENTS ILLUSTRATED BELOW

B. Charge-Enhanced Diode Random Access Memory (CED-RAM)
   Implemented in SOI Technology
    1. CED-RAM With N/I/P Diode
      (a) VCED-RAM With N/I/P Diode
      (b) LCED-RAM With N/I/P Diode
      (c) Operation Of CED-RAM With N/I/P Diode
    2. CED-RAM With P/I/N Diode
      (a) VCED-RAM With P/I/N Diode
      (b) LCED-RAM With P/I/N Diode
      (c) Operation Of CED-RAM With P/I/N Diode
    3. CED-RAM Process
      (a) VCED-RAM Process
      (b) LCED-RAM Process A GCD-RAM memory cell with an n+/i/p diode, such as illustrated and discussed with respect to the schematic in FIG. 2B, is discussed below in Section A1, and a GCD-RAM memory cell with a p+/i/n diode, such as illustrated and discussed with respect to the schematic in FIG. 3B, is discussed below in Section A2. Vertical and lateral n+/i/p diode structures and vertical and lateral p+/i/n diode structures are illustrated and discussed below. Charges are stored at the floating node and sustained across the intrinsic region of the diode. The state of the floating node thus sustained defines the binary state of the memory cell. The memory state of the cell is sensed by turning the access transistor on and sensing the potential of the bit line. This will be discussed in detail in sections related to the operation of the device (Sections A1C and A2C). Section A3 is directed toward processes for fabricating the GCD-RAM with vertical and lateral diodes.

A1. GCD-RAM with N/I/P Diode

A gate-controlled diode random access memory (GCD-RAM) cell embodiment that includes an n/i/p diode is discussed within this section. The n/i/p diode has a n-type anode and a p-type cathode. The majority carrier for the n/i/p diode is electrons, thus promoting quicker switching than provided by the hole majority carriers for a p/i/n diode. A cell structure with a vertical n/i/p diode is discussed in Section A1(a), a cell structure with a lateral n/i/p diode is discussed in Section A1(b), and cell operations for a GCD-RAM with a n/i/p diode is discussed in Section A1(c).

A1(a). VGCD-RAM with Integrated N/I/P Diode

Figure 6A:
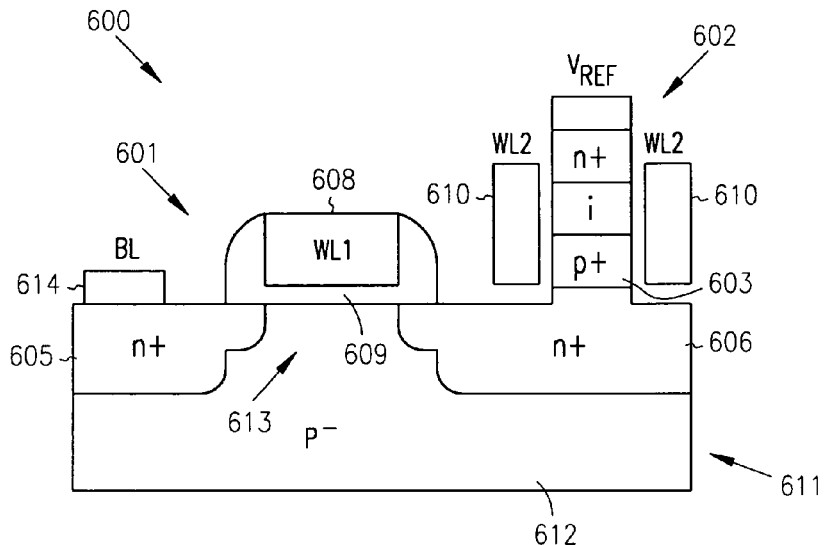
FIGS. 6A-6B illustrate a vertical gate-controlled diode random access memory (VGCD-RAM) cell with an n+/i/p+ diode, according to various embodiments of the present invention.
Figure 6B:
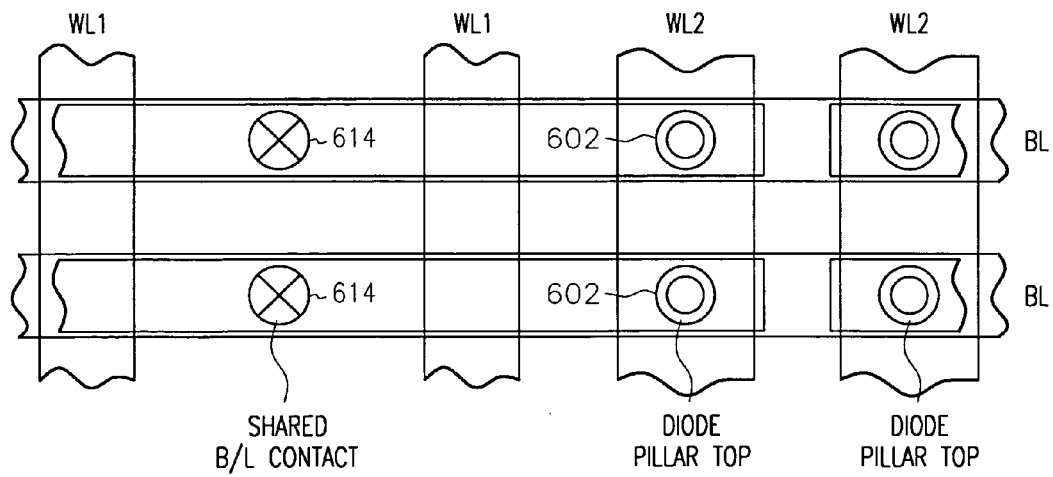

FIGS. 6A-6B illustrate a vertical gate-controlled diode random access memory (VGCD-RAM) cell with an n+/i/p+ diode, according to various embodiments of the present invention. The illustrated VGCD-RAM cell 600 includes an n-channel access transistor 601 and a vertically-oriented n+/i/p+ diode 602. In the illustrated embodiment, the access transistor 601 is formed in bulk silicon 611. The illustrated access transistor 601 includes a p− type body 612 and n+ diffusion regions that form the first and second nodes 605 and 606. The nodes are also referred to as source/drain regions. The body includes a channel region 613 between diffusion regions. A gate 608 is operatively disposed above and separated from the channel region 613 by a gate insulator 609. In the illustrated embodiments, a first word line (WL1) is either coupled to a gate 608 of the transistor or functions as the gate of the transistor. A bit line contact 614 is positioned in contact with the first node 605, and the vertically-oriented n+/i/p+ diode 602 is positioned on the second node 606. A second gate 610 is operatively positioned with respect to the diode. In the illustrated embodiment, a second word line is either coupled to a gate for the diode or functions to gate the diode.

The p+ (cathode) region 603 of the diode interfaces the n+ floating node 606 of the access transistor and is designed to provide a low breakdown strength of this n+/p+ junction. The breakdown of this n/p junction is gate-controlled using the second word line. In the illustrated VGCD-RAM cell, the second word line (WL2) surrounds the diode. The second word line (WL2) functions as a diode gate 610 to gate the intrinsic region as well as the n+/p+ junction. The charge of the memory cell is stored in the floating node across the intrinsic region. In the VGCD-RAM cell, the vertical width of the intrinsic region is defined and controlled to optimize the diode charge capacity, which is inversely proportional to the width, and to optimize the intrinsic switching speed, which is directly proportional to the width. The turn-on and turn-off characteristics of the n+/i/p+ are gate-controlled to provide very fast switching of the diode. The gated breakdown of n+/p+ floating node junction is very fast due to the peak field at the junction. The n+ (anode) node of the diode is connected to a reference voltage source typically in the range of 0.8-1.0 volt. The n+/i junction is held reverse biased ($V_{REF}$ is either zero or a positive potential) during standby mode of the memory cell. This will be discussed further in Section A1(c).

FIG. 6B illustrates a top view of a VGCD-RAM cell layout. The top of the diode pillar is shown to extend through the second word line (WL2). In various embodiments, the first and second word lines WL1 and WL2 are polysilicon word lines and bit lines (BL) are metal bit lines such as a first level of metal, M1. In various embodiments, bit line contacts are shared between adjacent cells to improve cell density. Various embodiments further improve cell density by sharing the second word line with adjacent cells.

The VGCD-RAM cell can be fabricated using conventional CMOS technology. The diode silicon pillars are etched on a p-type silicon substrate. In various embodiments, the VGCD-RAM cell is fabricated using a process similar to that disclosed in U.S. application Ser. No. 10/232,855 entitled "Gated Lateral Thyristor-Based Random Access Memory Cell," which has previously been incorporated by reference herein.

A1(b). LGCD-RAM with Integrated N/I/P Diode

Figure 7A:
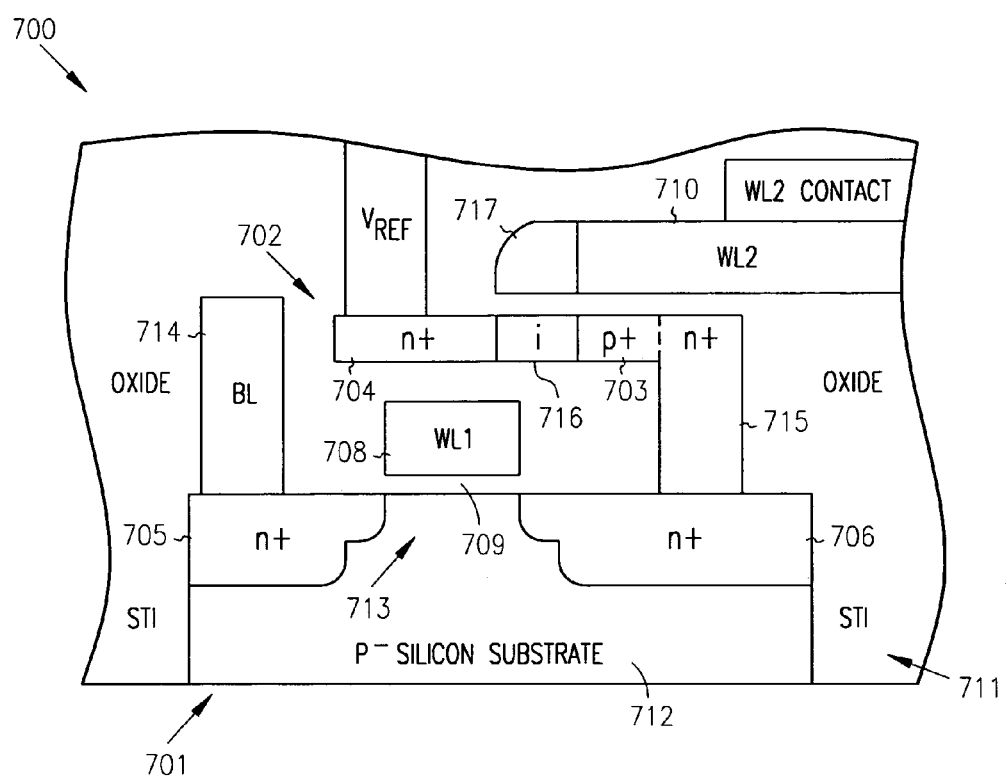
FIGS. 7A-7B illustrate a stacked lateral gate-controlled diode random access memory (LGCD-RAM) cell with an n+/i/p+ diode, according to various embodiments of the present invention.
Figure 7B:
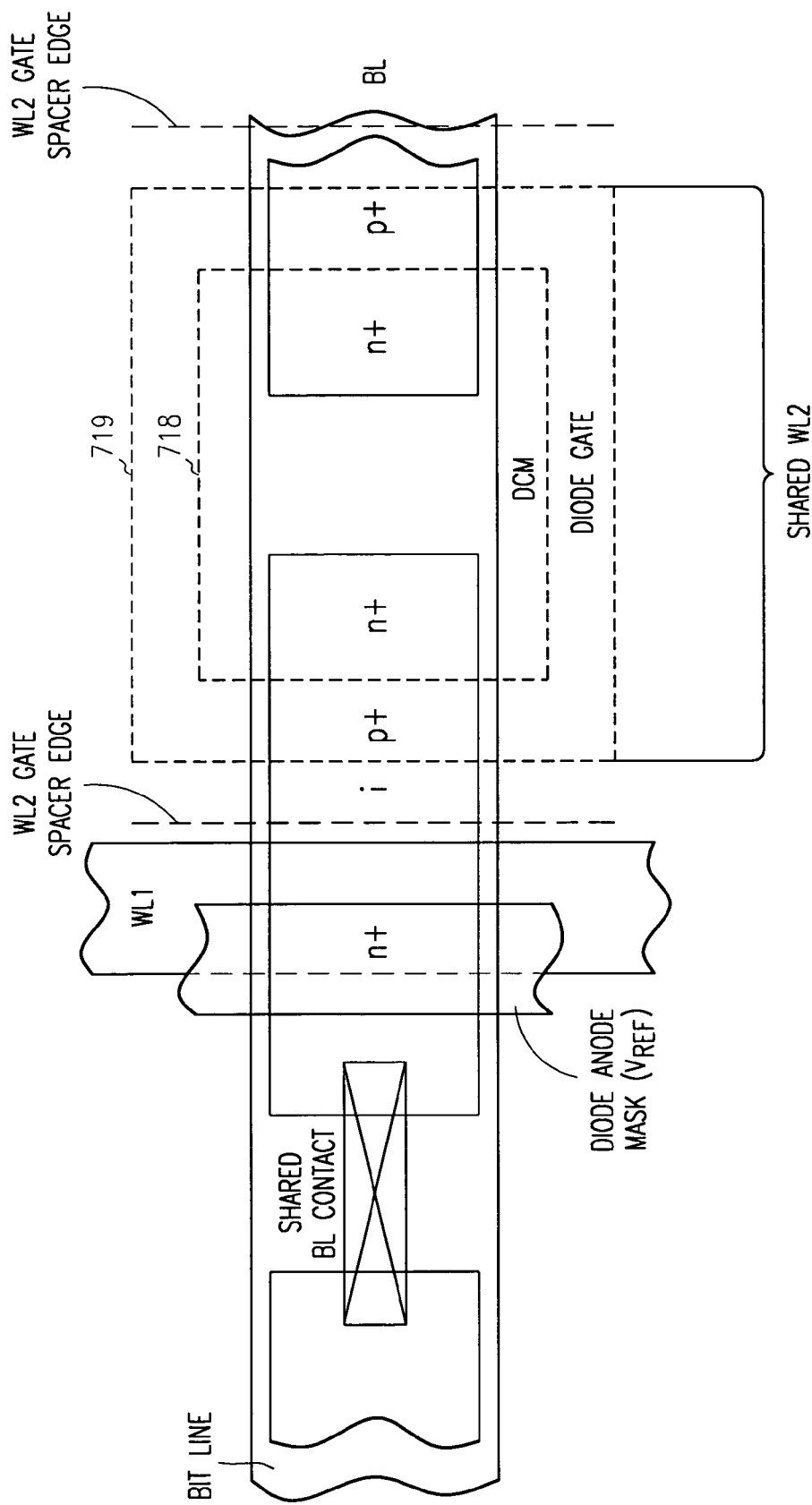

FIGS. 7A-7B illustrate a stacked lateral gate-controlled diode random access memory (LGCD-RAM) cell with an n+/i/p+ diode, according to various embodiments of the present invention. The illustrated VGCD-RAM cell 700 includes an n-channel access transistor 701 and a laterally-oriented n+/i/p+ diode 702 stacked on top of the access transistor. In the illustrated embodiment, the access transistor 701 is formed in bulk silicon 711. The illustrated access transistor includes a p− type body 712 and n+ diffusion regions that form the first and second nodes (source/drain regions) 705 and 706. The body 712 includes a channel region 713 between diffusion regions. A gate 708 is operatively disposed above and separated from the channel region 713 by a gate insulator 709. In the illustrated embodiments, a first word line (WL1) is either coupled to a gate of the transistor or functions as the gate of the transistor. A bit line contact 714 is positioned in contact with the first node, and a vertically-raised n+ region or pillar is positioned on the second node. The vertically-oriented n+ region 715 is in contact with the p+ cathode 703 of the lateral n+/i/p+ diode. A diode gate 710 is operatively positioned with respect to the diode 702. In the illustrated embodiment, a second word line (WL2) is either coupled to a gate of the diode or functions to gate the diode.

As illustrated in FIGS. 7A and 7B, the second word line (WL2) is positioned over the i/p+/n+ lateral region. The second word line WL2 gates the intrinsic region as well as the n+/p+ junction. In the LGCD-RAM cell, the lateral width of the intrinsic region 716 is defined and controlled to optimize the diode charge capacity, which is inversely proportional to the width, and to optimize the intrinsic switching speed, which is directly proportional to the width. In the illustrated embodiment, the spacer 717 is used to precisely define the intrinsic region 716.

The gate control enhances the turn-on and turn-off characteristics of the diode for both VGDRAM and LGDRAM cells to provide very fast switching of the diode. The gated breakdown of n+/p+ junction is also very fast due to the peak field at the junction. The n+ node (anode) 704 of the diode is connected to a reference voltage source typically in the range of ±0.8 volt.

FIG. 7B illustrates a top view of a LGCD-RAM cell layout. The masks are illustrated as dotted lines. In various embodiments, the first and second word lines WL1 and WL2 are polysilicon word lines and bit lines are metal bit lines such as a first level of metal, M1. In various embodiments, bit line contacts are shared between adjacent cells to improve cell density. Various embodiments further improve cell density by sharing the second word line with adjacent cells. The stacked diode cathode for the LGCD-RAM cell is fabricated using selective epitaxy process for "raised source-drain" technology and using a metal-induced lateral crystallization (MILC) technique adopted for thin-film transistor technology. The raised source-drain and MILC techniques have been discussed in U.S. application Ser. No. 10/232,855 entitled "Gated Lateral Thyristor-Based Random Access Memory Cell, which has been previously incorporated by reference. A diode cathode mask (DCM) 718 is used to perform the selective epitaxy process to form the raised floating node region 715 of the access transistor. A thin layer of amorphous silicon is deposited. In various embodiments, the layer of amorphous silicon is between 300 Å to 1000 Å. An amorphous silicon film mask is used to accurately and controllably deposit the amorphous silicon in a desired position and with a desired geometry for the diode. A low temperature oxide (LTO) layer is deposited and defined over the active region for crystallization of the silicon. The amorphous silicon is crystallized using a metal-induced-lateral-crystallization (MILC) technology. MILC technology uses the lateral migration of metals, such as nickel, to enhance the grain size and enhance crystallinity. The MILC process also smoothes out the polysilicon surface. Nickel is deposited over the defined anode region of the thin silicon film. In various embodiments, about 100 Å of nickel is deposited. Another mask is used to deposit nickel on the amorphous silicon as part of the MILC process. The lateral crystallization is carried out in a nitrogen ambient. The nickel is removed after crystallization. Another mask 719 is used to form the diode gate and dope the crystallized silicon layer. The layout scheme for LGCD-RAM cell is similar to the GLTRAM cell discussed in U.S. application Ser. No. 10/232,855 entitled "Gated Lateral Thyristor-Based Random Access Memory Cell, which has been previously incorporated by reference.

A1(c). Operation Of GCD-RAM with N/I/P Diode

Figure 8:
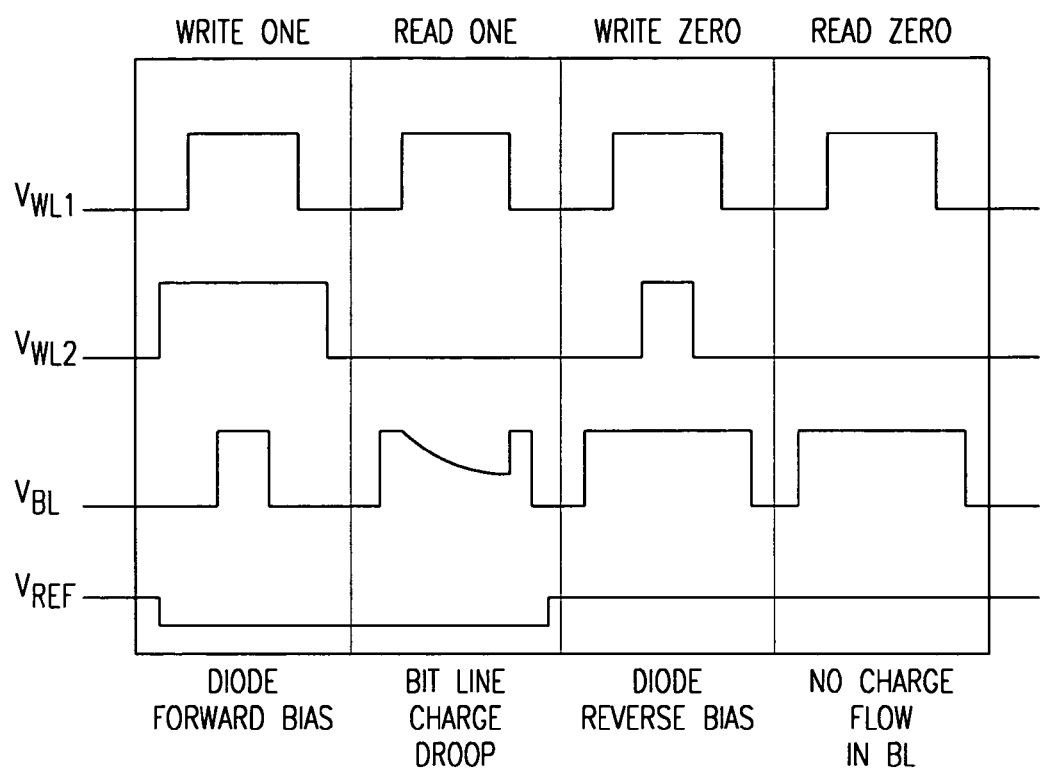
FIG. 8 illustrates read/write operations for a GCD-RAM with an n+/i/p+ diode such as for the VGCD-RAM of FIGS. 6A-6B and the LGCD-RAM cell of FIGS. 7A-7B, according to various embodiments of the present invention.

FIG. 8 illustrates read/write operations for a GCD-RAM with an n+/i/p+ diode such as for the VGCD-RAM of FIGS. 6A-6B and the LGCD-RAM cell of FIGS. 7A-7B, according to various embodiments of the present invention. By way of example, when the power supply voltage ($V_{DD}$) is 2.5 V, the diode reference potential ($V_{REF}$) is approximately 1 V, and the first word line pulse potential ($V_{WL1}$) is approximately 2.5V, the second word line pulse potential ($V_{WL2}$) is approximately 1.5 V, and the bit line pulse potential ($V_{BL}$) is approximately 2.5 V. The second word line WL2 is pulsed for both write-one and write-zero operations. The bit line BL is pulsed high for a shorter interval for write one and for a longer interval for write zero.

During write-one, $V_{BL}$ is raised and $V_{REF}$ is lowered such the $V_{BL}$ is significantly above $V_{REF}$. The second word line potential ($V_{WL2}$) is raised not only to assist in the reverse breakdown of the n+/p+ junction but also to switch the diode to high current low voltage forward mode by collapsing the breakover voltage of the diode. The raised potential of the n+ floating node, which is attributed to the raised $V_{WL1}$ that turns on the access transistor and the raised $V_{BL}$, capacitively couples the p+ cathode of the diode. The raised potential of the cathode further assists with forward biasing the diode into an "on" mode. The diode switches to the high conduction mode by the NDR effect (see FIG. 1D). Floating gate potential is discharged through the intrinsic region.

During write-zero, $V_{BL}$ is transferred to the floating node ($V_{WL1}$ is high) and the diode switches to reverse bias. $V_{WL2}$ assists in switching the diode from on to off completely within the short duration of the second word line pulse ($V_{WL2}$). At the steady state, the floating node n+ potential assumes the steady state potential of the bit line, and is held across the intrinsic region of the diode when the cell state is written to zero.

The state of the cell is read (read-one or read-zero) by turning the access transistor on (raising $V_{WL1}$) and sensing a pre-charged bit line potential ($V_{BL}$). If the cell has been written one, the pre-charged bit line potential droops when the cell is read because the diode is on and electrons are flowing through the diode and the access transistor to the pre-charged bit line. When the cell has been written zero, the diode is not conducting, and the pre-charged bit line potential remains unchanged when the cell is read.

The cell performance is dependent on the diode turn-off speed when transitioning from write-one to write-zero. The diode turn-off speed is dramatically enhanced by gating the diode to enhance the removal of stored charge from the intrinsic region of the diode. Since the stored charge volume is significantly lower in the lateral diode (due to the accurately formed intrinsic region using the MILC process), the diode is expected to be turned-off faster. Thus, the LGCD-RAM cell is expected to perform faster than the VGCD-RAM cell. The standby leakage current of the diode at the steady state is also reduced by pulsing the second word line WL2. In the steady state the diode remains reverse biased to ensure low standby leakage current. In this regard, the characteristics of VGCD-RAM and LGCD-RAM cells are similar to those of TRAM and GLTRAM cells.

A2. GCD-RAM with P/I/N Diode

A gate-controlled diode random access memory (GCD-RAM) cell that includes a p/i/n diode is discussed within this section. The p/i/n diode has a p-type anode and an n-type cathode. The majority carrier for the p/i/n diode is holes, which are less mobile than electrons which function as the majority carriers for n/i/p diodes. However, the p/i/n diodes are easier to fabricate with the n+ floating node of the n-channel access transistor. A cell structure with a vertical p/i/n diode is discussed in Section A2(a), a cell structure with a lateral p/i/n diode is discussed in Section A2(b), and cell operations for a GCD-RAM with a p/i/n diode is discussed in Section A2(c).

A2(a). VGCD-RAM with Integrated P/I/N Diode

Figure 9A:
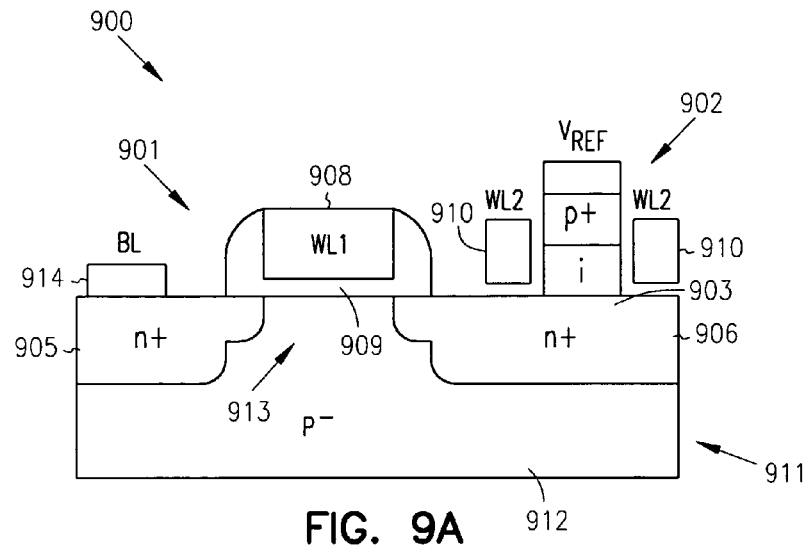
FIGS. 9A-9B illustrate a vertical gate-controlled diode random access memory (VGCD-RAM) cell with a p+/i/n+ diode, according to various embodiments of the present invention.
Figure 9B:
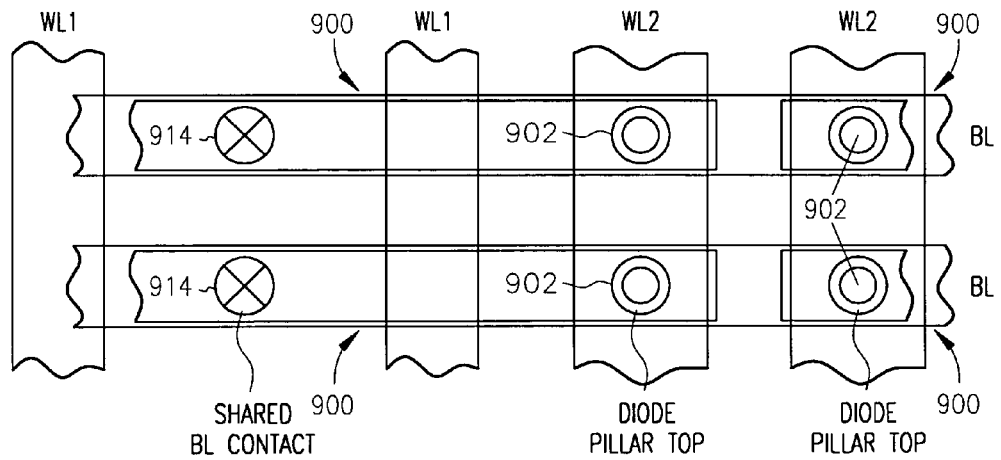

FIGS. 9A-9B illustrate a vertical gate-controlled diode random access memory (VGCD-RAM) cell with a p+/i/n+ diode, according to various embodiments of the present invention. The illustrated VGCD-RAM cell 900 includes an n-channel access transistor 901 and a vertically-oriented p+/i/n+ diode 902. In the illustrated embodiment, the access transistor is formed in bulk silicon 911. The illustrated access transistor 901 includes a p– type body 912 and n+ diffusion regions that form the first and second nodes 905 and 906. The nodes are also referred to as source/drain regions. The body includes a channel region 913 between diffusion regions. A gate 908 is operatively disposed above and separated from the channel region 913 by a gate insulator 909. In the illustrated embodiments, a first word line (WL1) is either coupled to a gate 908 of the transistor 901 or functions to gate the transistor. A bit line contact 914 is positioned on the first node 905, and the vertically-oriented p+/i/n+ diode is positioned in contact with the second node. A diode gate 920 is operatively positioned with respect to the diode 902.

The n+ (cathode) region 903 of the diode 902 is combined or integrated with the n+ floating node 906 of the access transistor 901 as shown. The second word line WL2 gate-controls the diodes of the VGCD-RAM cell. In the illustrated embodiment, the second word line WL2 surrounds the diode. The second word line WL2 gates the intrinsic region as well as the i/n region. The width control of the intrinsic region is based upon considerations similar to those previously discussed such as charge storage and recombination speed. Gate control provides fast on-to-off switching and low standby power as discussed earlier. The constructions and layout considerations of these cells are similar to those cells discussed earlier.

A2(b). LGCD-RAM with Integrated P/I/N Diode

Figure 10A:
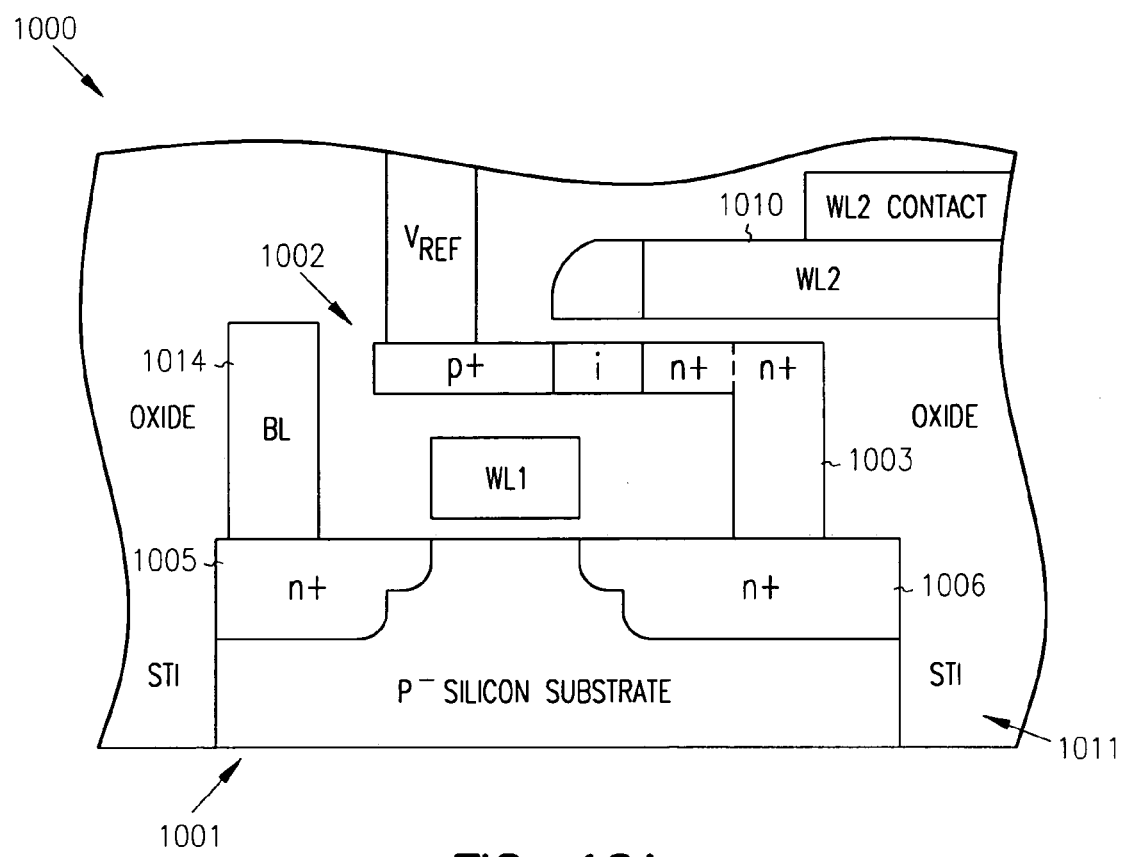
FIGS. 10A-10B illustrate a lateral gate-controlled diode random access memory (LGCD-RAM) cell with a p+/i/n+ diode, according to various embodiments of the present invention.
Figure 10B:
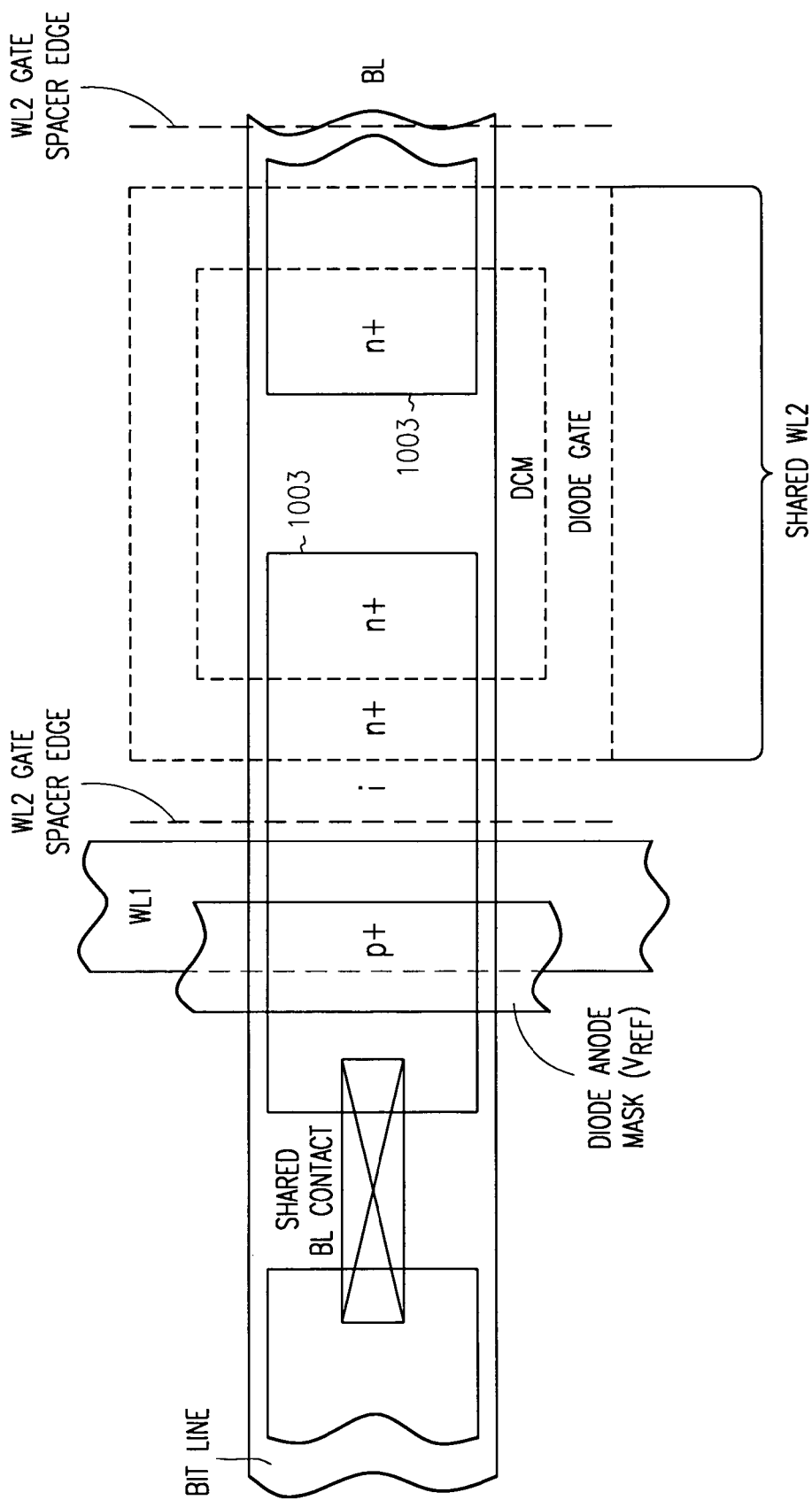

FIGS. 10A-10B illustrate a stacked lateral gate-controlled diode random access memory (LGCD-RAM) cell with a p+/i/n+ diode, according to various embodiments of the present invention. The illustrated VGCD-RAM cell 1000 includes an n-channel access transistor 1001 and a stacked version of a laterally-oriented p+/i/n+ diode 1002. In the illustrated embodiment, the access transistor is formed in bulk silicon 1011. The illustrated access transistor includes a p– type body and n+ diffusion regions that form the first and second nodes (source/drain regions) 1005 and 1006. The body includes a channel region between diffusion regions. A gate is operatively disposed above and separated from the channel region by a gate insulator. In the illustrated embodiments, a first word line (WL1) is either coupled to a gate of the transistor or functions to gate the transistor. A bit line contact 1014 is positioned in contact with the first node, and the vertically-oriented p+/i/n+ diode is positioned in contact with the second node. The n+ (cathode) region of the diode is combined with the n+ floating node of the access transistor as shown. The n+ cathode region 1003 is vertically formed using a selective epitaxy process associated with raised source-drain techniques. The lateral p+/i/n+ diode is formed using a MILC technique, as discussed herein. The intrinsic region of the diode is precisely controlled by the spacer width of the gate WL2 controlling the diode.

A diode gate 1010 is operatively positioned with respect to the diode 1002. In the illustrated embodiment, a second word line (WL2) is either coupled to a gate of the diode or functions to gate the diode. The diodes are gate-controlled with the diode gate 1010. The second word line (WL2) is on top of the p+/i/n+ lateral region. WL2 gates the intrinsic region as well as the i/n+ region of the diode. The width control of the intrinsic region for either version is made from considerations similar to those considerations previously outlined. Gate control provides fast on to off switching and low standby power as explained earlier. The constructions and layout considerations of these cells are similar to those cells discussed earlier. FIG. 10B illustrates on embodiment of a cell layout.

A2(c). Operation of GCD-RAM with P/I/N Diode

Figure 11:
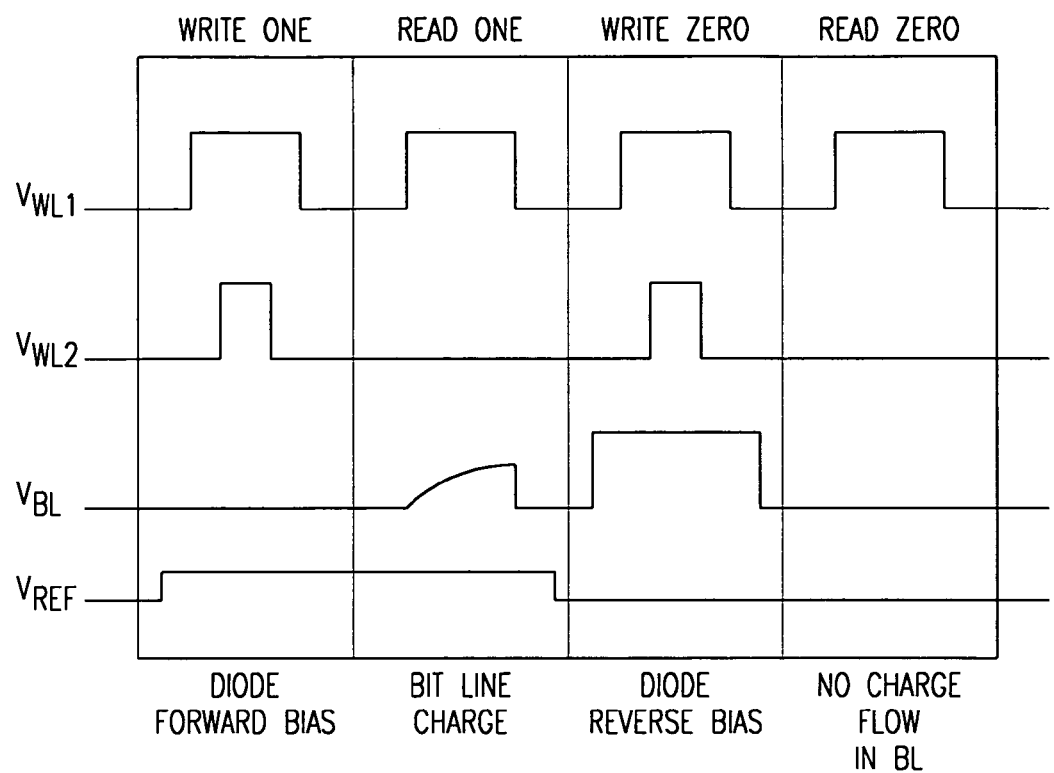
FIG. 11 illustrates read/write operations for a GCD-RAM with a p+/i/n+ diode such as for the VGCD-RAM of FIGS. 9A-9B and the LGCD-RAM cell of FIGS. 10A-10B, according to various embodiments of the present invention.

FIG. 11 illustrates read/write operations for a GCD-RAM with a p+/i/n+ diode such as for the VGCD-RAM of FIGS. 9A-9B and the LGCD-RAM cell of FIGS. 10A-10B, according to various embodiments of the present invention. In various embodiments, the node potentials are similar to the potentials previously discussed with respect to GCD-RAM memory cells with an n+/i/p+ diode as shown in FIG. 8 and discussed in Section A1(c) with the exception that the reference potential is held at a positive value of approximately +0.8 volts for the different read and write operations. The operation conditions and pulse widths for WL2 and the bit line BL are different from FIG. 8. The second word line (WL2) is pulsed for both write-one and write-zero operations with the same pulse width as shown. For the p+/i/n+ diode, the bit line (BL) is pulsed for write-zero operations and is held low for all other operations. This is different from the operation of the GCD-RAM cell with the n+/i/p diode.

For write-one operations, $V_{BL}$ is held low, $V_{WL1}$ is raised, and the forward bias of the diode is controlled by $V_{WL2}$, and the diode readily switches to the low potential high conduction state (See FIG. 1C). The n+ floating node (cathode) potential assumes the stable low state "one."

For write-zero operations, $V_{BL}$ is held high, $V_{WL1}$ is raised, the diode remains reverse biased, and the floating node assumes a high potential state "zero." $V_{WL2}$ assists in switching the diode transition from on to off completely within the short duration of the second word line (WL2) pulse during write-zero by enhancing charge recombination in the intrinsic region. At steady state the floating node assumes a potential of $|V_{BL}-V_{REF}|$ and the diode remains reverse-biased.

During read-one, the access transistor is turned on (raise $V_{WL1}$) and a floating bit line potential ($V_{BL}$) rises as holes flow through the high conducting diode and the access transistor to the bit line. During read-zero, the n+ floating node remains high and the diode remains reverse biased. The potential of the floating bit line does not change since there is no charge flow from the floating node to the bit line when the access transistor is turned on.

A3. GCD-RAM Process

The above-discussed GCD-RAM cell embodiments include VGCD-RAM cells (memory cells with vertical p+/i/n+ diodes and memory cells with vertical n+/i/p diodes), and further include LGCD-RAM cells (memory cells with lateral p+/i/n+ diodes and memory cells with lateral n+/i/p diodes).

A3(a). VGCD-RAM Process

VGCD-RAM cells are capable of being fabricated using conventional bulk silicon CMOS technology. In various embodiments, the process sequence includes: defining and etching the diode pillar region on a starting intrinsic or very lightly doped p− substrate; implanting the bottom p+ (with respect to the n+/i/p+ diode) or the bottom n+ (with respect to the p+/i/n diode) part of the diode using an oxide cap protection on the top of the pillar; simultaneously forming the polysilicon first word line WL1 and second word line WL2 gates using anisotropic polysilicon etch after gate oxidation; simultaneously implanting source/drain regions and gate (n+), and planarization; and forming the diode anode (n+ for the n+/i/p+ diode, p+ for the p+/i/n diode) by ion implantation through the contact hole. The depth of the intrinsic region is controlled by appropriate thermal anneal following final implantation.

A3(b). LGCD-RAM Process

The LGCD-RAM cell includes a lateral diode. The second word line WL2 gate is formed to overlap all lateral regions of the diode except for the anode region. The gate controls the performance of the diode. Various embodiments fabricate the diodes using thin film technology (TFT). The fabrication approach and layout considerations for the TFT diodes are similar to those considerations for the GLTRAM cell discussed in U.S. application Ser. No. 10/232,855 entitled "Gated Lateral Thyristor-Based Random Access Memory Cell, which has been previously incorporated by reference. The stacked diode for the LGCD-RAM cell is fabricated using selective epitaxy process for "raised source-drain" technology and using a metal-induced lateral crystallization (MILC) technique adopted for thin-film transistor technology.

Figure 12A:
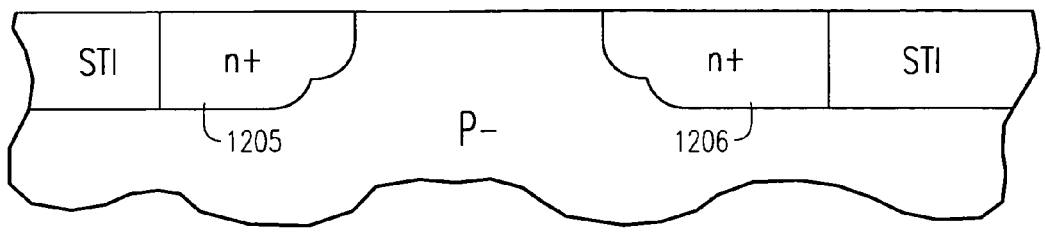
FIGS. 12A-12E illustrate a process for forming the LGCD-RAM cell according to various embodiments of the present invention.

FIGS. 12A-12E illustrate a process for forming the LGCD-RAM cell according to various embodiments of the present invention. The process steps for fabrication of the LGCD-RAM cell is compatible to standard processing technology. Referring to FIG. 12A, the n+ diffusion regions 1205 and 1206 and for the access transistor are formed in a p− substrate using standard fabrication steps. The access transistor is isolated using shallow trench isolation (STI) processing techniques, as represented by the illustrated STI regions.

Figure 12B:
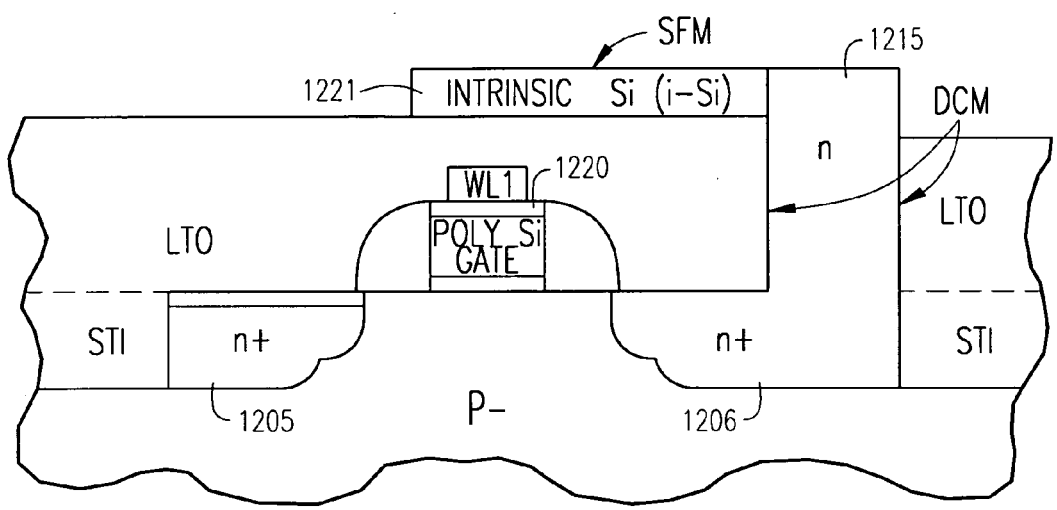

FIG. 12B shows a formed gate oxide, polysilicon gate, and corresponding spacer. The drain region and the polysilicon gate are silicided (shown as 1220) for contact to a bit line (BL) and a first word line (WL1), respectively. A block source mask (BS) is used to prevent the silicidation of the n+ diffused source region by leaving an oxide layer over the region. Subsequently, an oxide layer, such as a low-temperature oxide layer (LTO), is deposited. The raised n+ region 1215 is defined in the oxide layer, and windows are opened in the silicon for selective epitaxy deposition process to raise the defined n+ region 1206 to form the n+ region 1215. A diode cathode mask (DCM) is used to perform the selective epitaxy process to form the raised source region of the access transistor. A thin layer of intrinsic amorphous silicon 1221 is deposited. In various embodiments, the layer of amorphous silicon is between 300 Å to 1000 Å. An amorphous silicon film mask (SFM) is used to accurately and controllably deposit the amorphous silicon in a desired position and with a desired geometry for the diode.

Figure 12C:
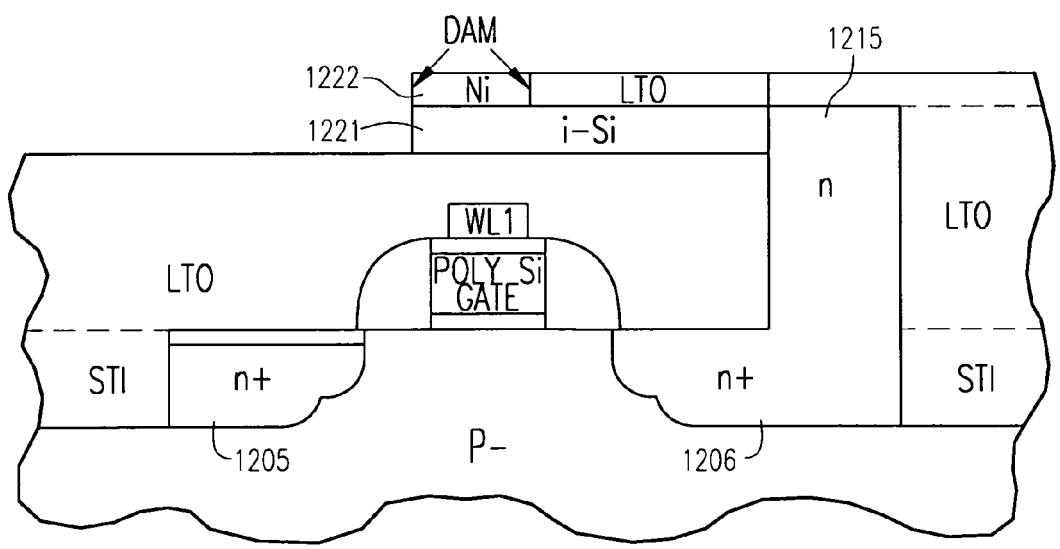

Referring to FIG. 12C, a layer of LTO is deposited and defined over the active region of the access device for crystallization of silicon. The amorphous silicon is crystallized using a metal-induced lateral crystallization (MILC) technique. Metal-induced-lateral-crystallization (MILC) uses the lateral migration of metals, such as nickel to enhance the grain size and provide better crystallinity. The MILC process also smoothes out the polysilicon surface. In various embodiments, nickel is deposited over the defined anode region of the thin silicon film. In various embodiments, about 100 Å of nickel is deposited. A diode anode mask (DAM) is used to deposit nickel 1222 on the amorphous silicon as part of the MILC process. The lateral crystallization is carried out in a nitrogen ambient.

Figure 12D:
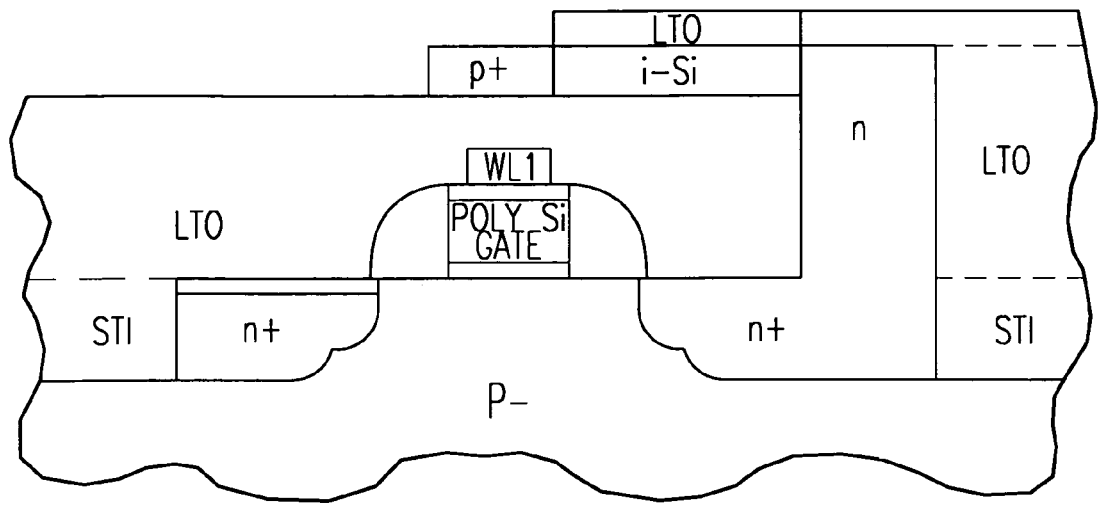

MILC uses a low temperature oxide (LTO), which is an oxide deposited by CVD at low temperature (below ~500° C.). Referring to FIG. 12D, the nickel is removed after crystallization. Using LTO as a mask, boron is implanted to define the p+ anode region of the thyristor. Using a reverse DGM mask, phosphorous is implanted to define the cathode (n) region of the diode.

Figure 12E:
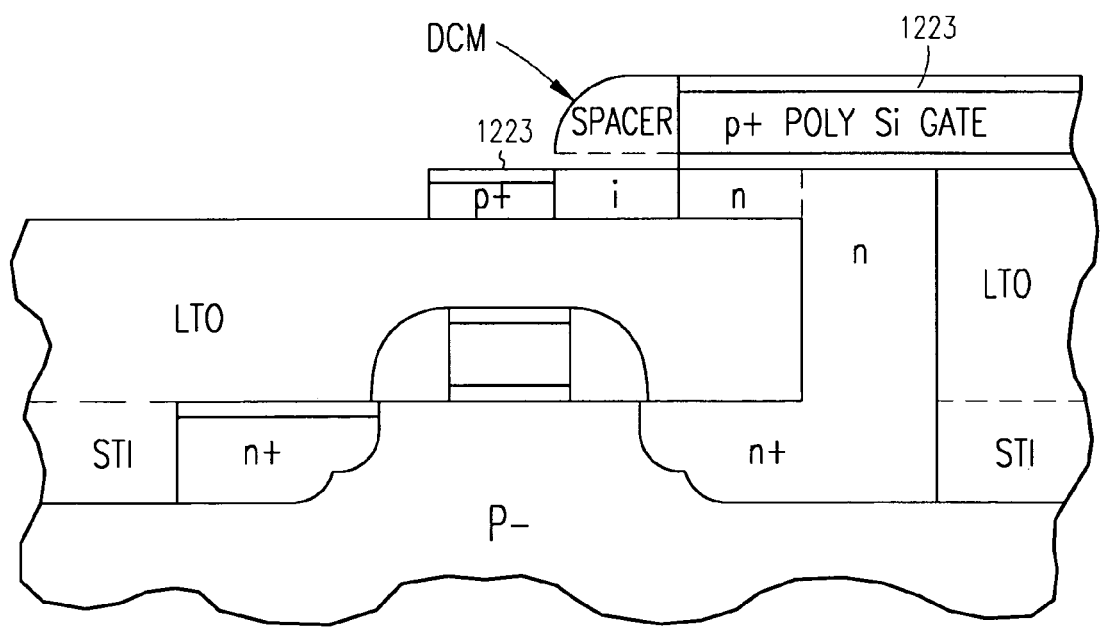

Referring to FIG. 12E, the LTO is removed and a gate oxide is grown on top of the crystallized silicon thin film. A second word line polysilicon gate mask (or diode gate mask DGM) is used to define the polysilicon gate. As shown in FIG. 12E, the polysilicon gate for the diode is formed on the gate oxide, and the spacer edge defines the p+/i lateral junction. After the gate processing step, both the anode p+ and the poly n+ gate for the second word line are silicided, as shown at 1223. The term silicided or silicide refers to a metal silicide such as a nickel-silicide ($NiSi_2$ or $Ni_2Si$), cobalt-silicide ($CoSi_2$), titaniumsilicide (TiSi$_2$), tungsten-silicide (WSi$_2$), and the like. These silicides reduce the parasitic series resistance. Contact and metallization steps follow.

B. Charge-Enhanced Diode Random Access Memory (CED-RAM) Implemented in SOI Technology A CED-RAM memory cell with an n+/i/p diode, such as illustrated and discussed with respect to the schematic in FIG. 2A, is discussed below in Section B1, and a CED-RAM memory cell with a p+/i/n diode, such as illustrated and discussed with respect to the schematic in FIG. 3A, is discussed below in Section B2. Vertical and lateral n+/i/p diode structures and vertical and lateral p+/i/n diode structures are illustrated and discussed below. Additionally, memory cell structures are disclosed below where the diodes are integrally formed within the floating body of the access transistor, or are formed on or over the floating node of the access transistor. Section B3 is directed to processes for forming the CED-RAM cell with vertical and lateral diodes.

The memory cell operation is based on controlling charges across the intrinsic region of the diode to provide the binary state of the memory cell. The memory states are stored at the floating node. The memory states of the cell are sensed by turning the access transistor on and sensing the potential of the bit line. Internally generated floating body charges are used to enhance the diode performance for the proposed memory cells.

In various embodiments, holes are generated in the floating body of the SOI transistor by impact ionization when the transistor is operating in FET mode. In the FET operational mode, a voltage pulse is applied to the drain when the word line is held high such that the transistor operates in saturation. An excess of hole charges is created near the drain region due to the impact ionization mechanism associated with the device operation in saturation. In various embodiments, excess electrons are also generated in the floating body to change the potential across the diode and assist with switching.

In various embodiments, both electron and hole charges are generated in the floating body of the SOI transistor by parasitic lateral bipolar action (n-p-n for SOI-NFET and p-n-p for SOI-PFET) when operating in bipolar mode. A lateral parasitic bipolar junction transistor (BJT) is associated with a FET device. Various potentials are appropriately applied such that the parasitic transistor generates a desired polarity of charge (electron or hole) in the floating body of the FET.

These charge generating techniques are able to generate either excess electrons or excess holes to alter the floating body potential and thus the potential across the diode. These excess charges enhance the p/i/n or n/i/p diode performance, thereby enhancing the performance of the memory cells. The enhancement provided by these excess charges is sufficient for many application to be able to eliminate a gate control enhancement of the diode. Thus, denser memory cells are capable of being fabricated using a simpler process. The memory cell includes a SOI access transistor. The gate of the access transistor is tied to a word line WL, one of the diffusion regions (e.g. a first node or drain) is tied to a bit line (BL) while the other of the diffusion regions (e.g. a second node or source) is floating and holds the memory state (high potential or low potential). The floating diffusion region is in contact with one of the terminals of the diode. The diode has an intrinsic region between an anode and cathode. In various embodiments, the diode is integrated with the floating diffusion region. The other end of the diode is tied to a reference potential.

A number of embodiments for integrating the diode with the SOI access transistor to form the memory cell are discussed below. In various embodiments, a lateral planar diode is integrated into the floating body of the SOI access transistor. In various embodiments, a vertical diode is integrated above the floating node, similar to the VGCD-RAM without the second word line WL2 used to gate the diode in the VGCD-RAM. In various embodiments, a stacked diode formed using a TFT process is integrated to be in contact with the floating node, similar to the LGCD-RAM without the second word line WL2 used to gate the diode in the LGCD-RAM. In each of the above-identified embodiments, the diode can be either a p/i/n diode or an n/i/p diode. The lateral planar diode integrated into the floating body of the SOI access transistor involves a simpler fabrication process. The vertical diode integrated above the floating node provides a denser memory cell. Both will be described here with reference to NFET-SOI access transistor for the cell implementation. The stacked versions involve more complex processes.

Various embodiments include complementary cells formed using a PFET-SOI access transistor. For the sake of brevity, these complementary PFET-SOI cells are not expressly discussed below, but are intended to be within the scope of this disclosure. Those of ordinary skill in the art will understand, upon reading and comprehending this disclosure, how to fabricate these complementary cells in accordance with the teachings of this application. The lateral forms are identified herein as lateral charge-enhanced diode random access memory (LCED-RAM) cells and the vertical forms are identified herein as vertical charge-enhanced diode random access memory (VCED-RAM) cells.

B1. CED-RAM with N/I/P Diode

A charge-enhanced diode random access memory (CED-RAM) cell that includes an n/i/p diode is discussed within this section. The n/i/p diode has an n-type anode and a p-type cathode. The majority carrier for the n/i/p diode is electrons, thus promoting quicker switching than provided by the hole majority carriers for a p/i/n diode. A cell structure with a vertical n/i/p diode is discussed in Section B1(a), a cell structure with a lateral n/i/p diode is discussed in Section B1(b), and cell operations for a GCD-RAM with a n/i/p diode is discussed in Section B1(c).

B1 (a). VCED-RAM with N/I/P Diode

Figure 13:
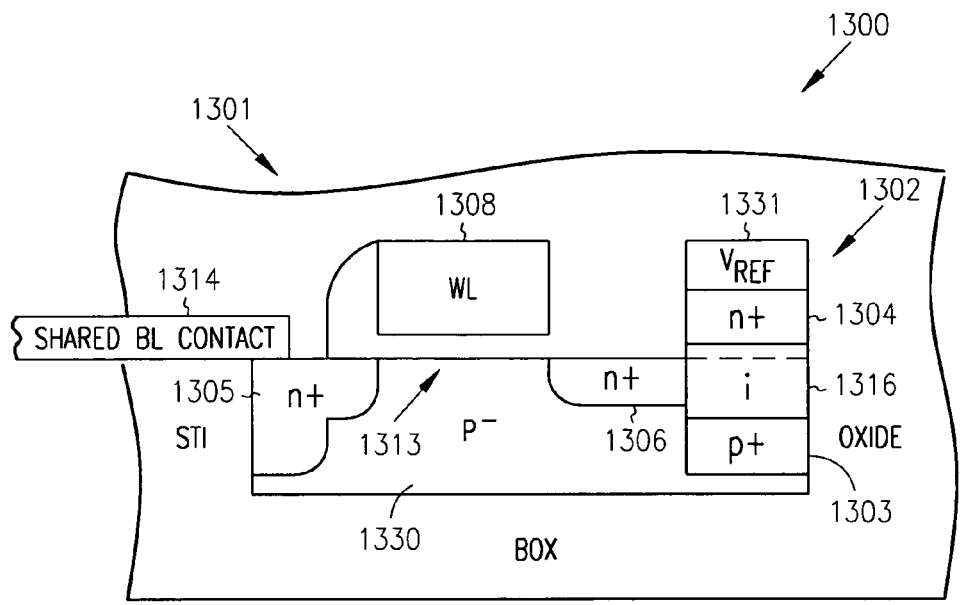
FIG. 13 illustrates a vertical charge-enhanced diode random access memory (VCED-RAM) cell with an n+/i/p diode, according to various embodiments of the present invention.

FIG. 13 illustrates a vertical charge-enhanced diode random access memory (VCED-RAM) cell with an n+/i/p diode, according to various embodiments of the present invention. The illustrated memory cell 1300 is formed in a semiconductor volume 1330 over a buried oxide (BOX) region. In various embodiments, the depth to the BOX region is approximately 100 nm in 0.1 micron lithography. In the illustrated embodiment, the semiconductor volume include either an intrinsic silicon or a very lightly-doped p− silicon. The access transistor 1301 and a portion of the vertical diode 1302 are formed in the semiconductor volume. A gate 1308 is formed over a channel region 1313 of the transistor. Appropriate masking is provided to form the illustrated structure. The p+ cathode 1303 of the diode 1302 is formed by implanting a p-type dopant with a desired energy to achieve a desired depth. In various embodiment, an appropriate amount of an n-type dopant is implanted if the starting substrate is lightly doped p− with a desired energy to compensate for the p-type dopant and thus form the intrinsic region 1316. In various embodiments, if the starting substrate is intrinsic, this step may be eliminated, but an appropriate p-type implant is used to create the p− body region. In various vertical embodiments, the depth of the intrinsic region 1316 is approximately 10-30 nm in a 0.1 micron lithography. The intrinsic region is thicker in various embodiments. A first diffusion region (n+) 1305 and a second diffusion region (n+) 1306 are formed by implanting n-type dopants. The n+ diffusion region 1306 interfaces the intrinsic region 1316.

The illustrated structure includes a shared bit line contact 1314 in contact with the first diffusion region 1305 of the memory cell. An adjacent memory cell also uses the shared bit line contact. A selective epitaxy process is used to form the n+ anode 1304 of the diode. A diode reference voltage ($V_{REF}$) contact 1331 is formed on the anode 1304 of the diode.

Figure 14:
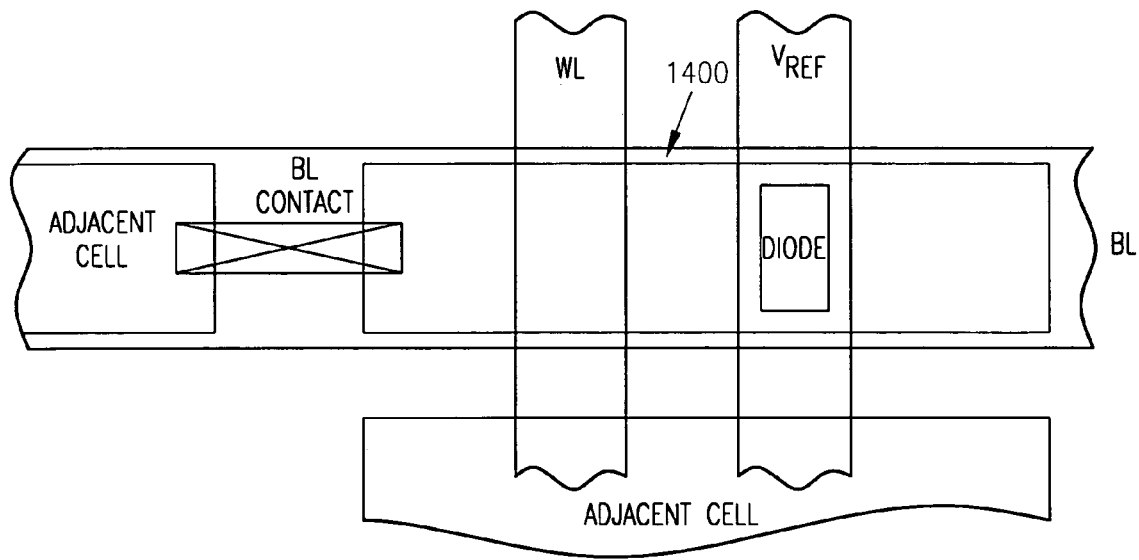
FIG. 14 illustrates a top view of a VCED-RAM cell, such as the VCED-RAM cell with an n+/i/p diode of FIG. 13.

FIG. 14 illustrates a top view of a VCED-RAM cell, such as the VCED-RAM cell with an n+/i/p diode of FIG. 13. The word line (WL) and reference line ($V_{REF}$) are illustrated as parallel to each other, and orthogonal to the bit line (BL). The illustrated memory cell 1400 shares a bit line contact 1414 with an adjacent memory cell to the left, the $V_{REF}$ line contacts the diode 1431 which optionally could be shared with the adjacent cell to the right (not shown). Other layout schemes can be engineered. As such, the present invention is not limited to the illustrated layout.

The n+/i/p diode is vertically formed within the floating body of the access device. The figures illustrate contacts for the bit line BL, the word line WL and the diode reference potential nodes. In various embodiments, both the bit-line contact and the diode contact are shared with adjacent cells in opposite ends to improve cell density similar to the bulk memory devices.

In various embodiments such as shown in FIGS. 13 and 14, the VCED-RAM cell is formed using selective epitaxy and raised source/drain technology. In various embodiments, the starting material is an intrinsic silicon wafer or a lightly-doped p-SOI silicon wafer of appropriate doping. The vertical depth of the intrinsic region is better controlled using slow deposition selective epitaxy over the buried p or p+ pocket for VCED-RAM case compared to the lateral version of LCED-RAM, although the process is more complex.

Figure 15:
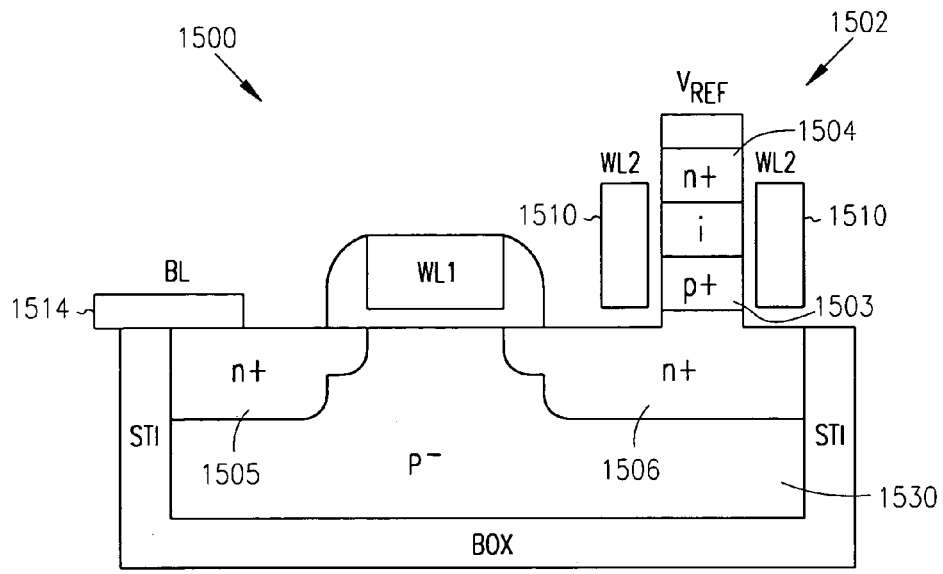
FIG. 15 illustrates a vertical charge-enhanced diode random access memory (VCED-RAM) cell with an n+/i/p diode, according to various embodiments of the present invention.

FIG. 15 illustrates a gate-controlled version of a vertical charge-enhanced diode random access memory (VCED-RAM) cell with an n+/i/p diode, according to various embodiments of the present invention. The illustrated memory cell 1500 is formed in a semiconductor volume 1530 over a buried oxide (BOX) region. In various embodiments, the depth to the BOX region is approximately 100 nm in 0.1 micron lithography. In the illustrated embodiment, the semiconductor volume include p− silicon.

The illustrated first and second diffusion regions 1505 and 1506 are formed by implanting n-type dopants. The bit line contact 1514 is formed in contact with the first diffusion region 1505, and the second diffusion region 1506 forms a floating node for the access transistor. An n+/i/p+ diode 1502 is vertically formed on the second diffusion region using selective epitaxy and raised source/drain technology. The p+cathode 1503 of the diode interfaces with the n+floating node of the transistor. A $V_{REF}$ contact 1531 is formed to contact the n+ anode 1504 of the diode. In various embodiments, the diode is gate-controlled via diode gate 1510, as illustrated by the second word line that surrounds the diode pillar. Thus, various SOI embodiments use gate-controlled diodes in place of or in addition to a charge-enhanced implementation.

B1 (b). LCED-RAM with N/I/P Diode

Figure 16:
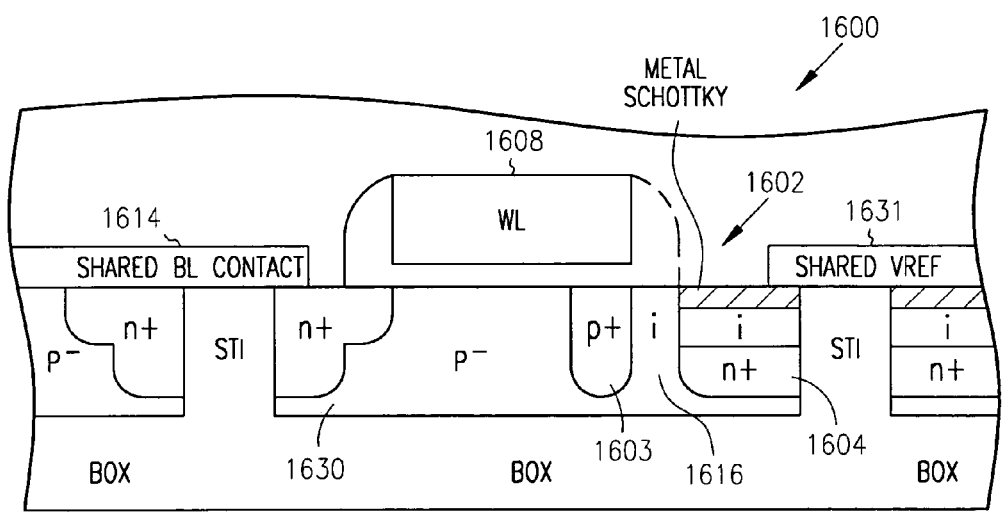
FIG. 16 illustrates a lateral charge-enhanced diode random access memory (LCED-RAM) cell with an n+/i/p diode, according to various embodiments of the present invention.

FIG. 16 illustrates a lateral charge-enhanced diode random access memory (LCED-RAM) cell with an n+/i/p diode, according to various embodiments of the present invention. The illustrated memory cell 1600 is formed in a semiconductor volume 1630 over a buried oxide (BOX) region. In various embodiments, the depth to the BOX region is approximately 100 nm in 0.1 micron lithography. In the illustrated embodiment, the semiconductor volume includes either an intrinsic silicon or a lightly-doped p− silicon. The n+/i/p diode 1602 is placed within the floating body of the access device. The figures illustrate contacts for bit line 1614, word line 1608 and the diode reference potential line 1631. In various embodiments, both the bit line contact as well as the diode contact are shared with adjacent cells in opposite ends to improve cell density similar to the bulk memory devices. In various embodiments, the LCED-RAM cell is fabricated using standard SOI-CMOS technology. The intrinsic region 1616 of the diode is defined by lithography and lateral diffusion of the p+ and n+ diffusion pockets 1603 and 1604 (which functions as the cathode and anode) of the diode for the LCED-RAM cell. In various embodiments, the cell is fabricated using an intrinsic SOI wafer as a starting material and subsequently doping the substrate appropriately.

The memory cell illustrated in FIG. 16 is very dense, and is capable of being fabricated using a relatively simple process, including a selective spacer process (represented by the dotted line). The formation of the intrinsic region 1616 using the selective spacer process depends on the spacer geometry, the doping levels of the p-type dopant pocket and the n-type dopant pocket, and the thermal budget for thermal diffusion and recombination of the p-type and n-type dopants. One affect of the p+ pocket beneath the gate is to raise the threshold voltage of the FET device. Thus, in various embodiments, the concentration of the p-type dopant is appropriately adjusted (e.g. $10^{18}$ rather than $10^{19}$ or $10^{20}$ doping concentrations) to appropriately control the threshold voltage of the access transistor.

As illustrated in FIG. 16, the n+ anode 1604 of the n+/i/p diode 1602 is separated from the $V_{REF}$ contact 1631 by an intrinsic region. Thus, the n+ diffusion region 1604 is isolated from the $V_{REF}$ contact 1631 and is capable of functioning as a floating node for the access transistor. In the illustrated embodiment, an n+ metal silicide is positioned between the $V_{REF}$ contact and the intrinsic region above the n+ anode 1604. The silicide and the intrinsic region form a metal Schottky diode equivalent to (n+/i) diode.

Figure 17:
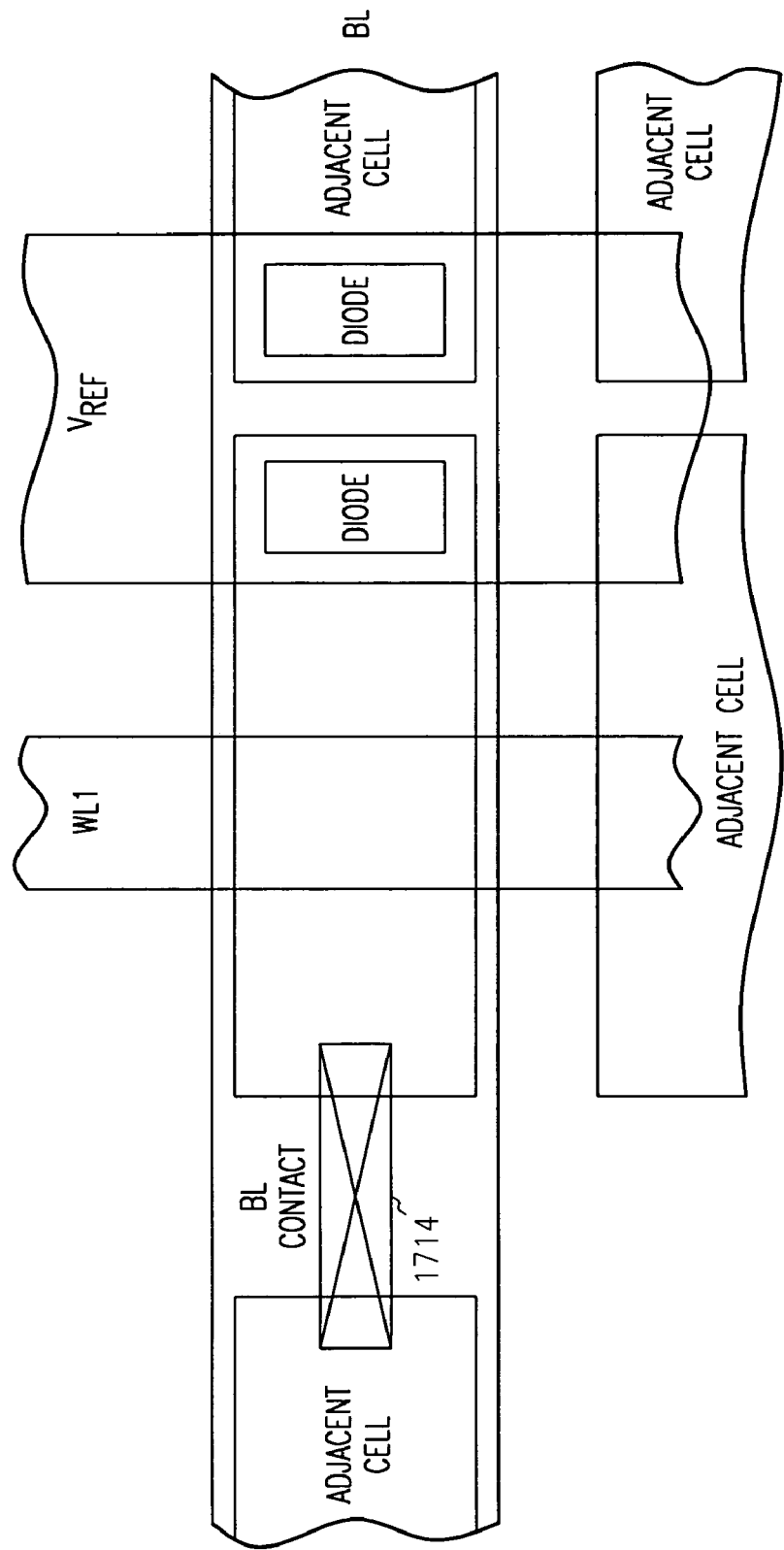
FIG. 17 illustrates a top view of a LCED-RAM cell, such as the LCED-RAM cell with an n+/i/p diode of FIG. 16.

FIG. 17 illustrates a top view of a LCED-RAM cell, such as the LCED-RAM cell with an n+/i/p diode of FIG. 16. The shared bit line contacts 1714 and diode reference line contacts 1731 are illustrated for the memory cell. Other layouts can be engineered. Thus, the present invention is not limited to a particular cell layout.

Figure 18:
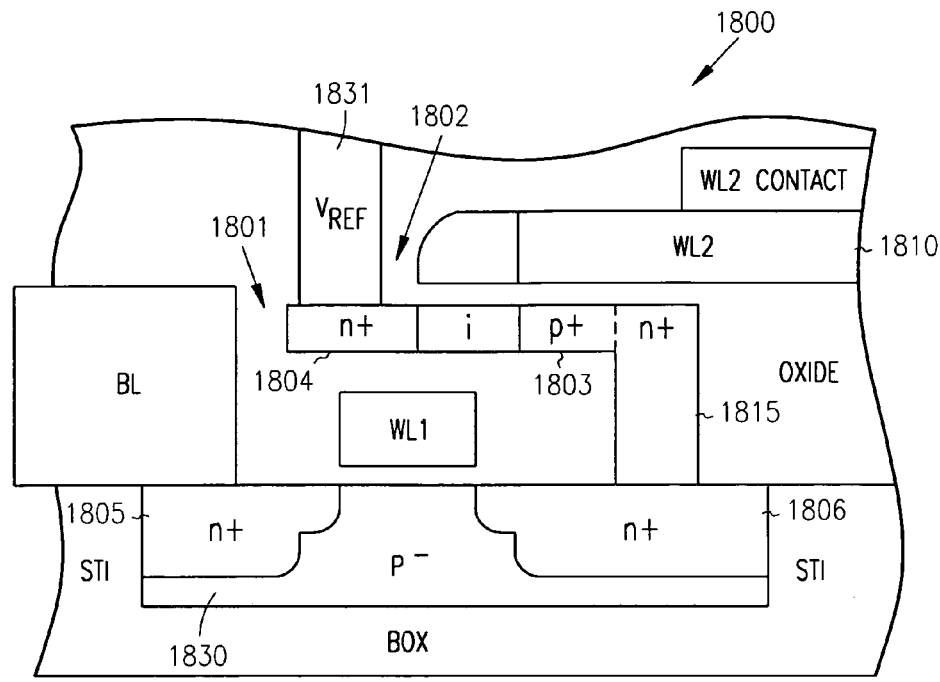
FIG. 18 illustrates a stacked lateral charge-enhanced diode random access memory (LCED-RAM) cell with an n+/i/p diode, according to various embodiments of the present invention.

FIG. 18 illustrates a stacked lateral charge-enhanced diode random access memory (LCED-RAM) cell with an n+/i/p diode, according to various embodiments of the present invention. The illustrated memory cell 1800 is formed in a semiconductor volume 1830 over a buried oxide (BOX) region. In various embodiments, the depth to the BOX region is approximately 100 nm in 0.1 micron lithography. In the illustrated embodiment, the semiconductor volume include p− silicon.

The illustrated first and second diffusion regions 1805 and 1806 are formed by implanting n-type dopants. The bit line contact 1814 is formed in contact with the first diffusion region 1805, and the second diffusion region 1806 forms a floating node for the access transistor 1801. An n+/i/p+ diode 1802 is laterally formed over the transistor 1801 and in contact with the second diffusion region 1806 using selective epitaxy and raised source/drain technology, and further using TFT and MILC technology as discussed previously. The n+ raised region 1815 is integrated with the n+ floating node 1806 of the transistor. The p+ cathode 1803 is in contact with the floating node 1806 through the n+ raised region 1815. A $V_{REF}$ contact 1831 is formed to contact the n+ anode 1804 of the lateral diode 1802. In various embodiments, the diode is gate-controlled, as illustrated by the second word line (WL2) that functions as the diode gate 1810. Thus, as illustrated here, various SOI embodiments use gate-controlled diodes in place of or in addition to a charge-enhanced implementation.

B1 (c). Operation Of CED-RAM with N/I/P Diode

Figure 19:
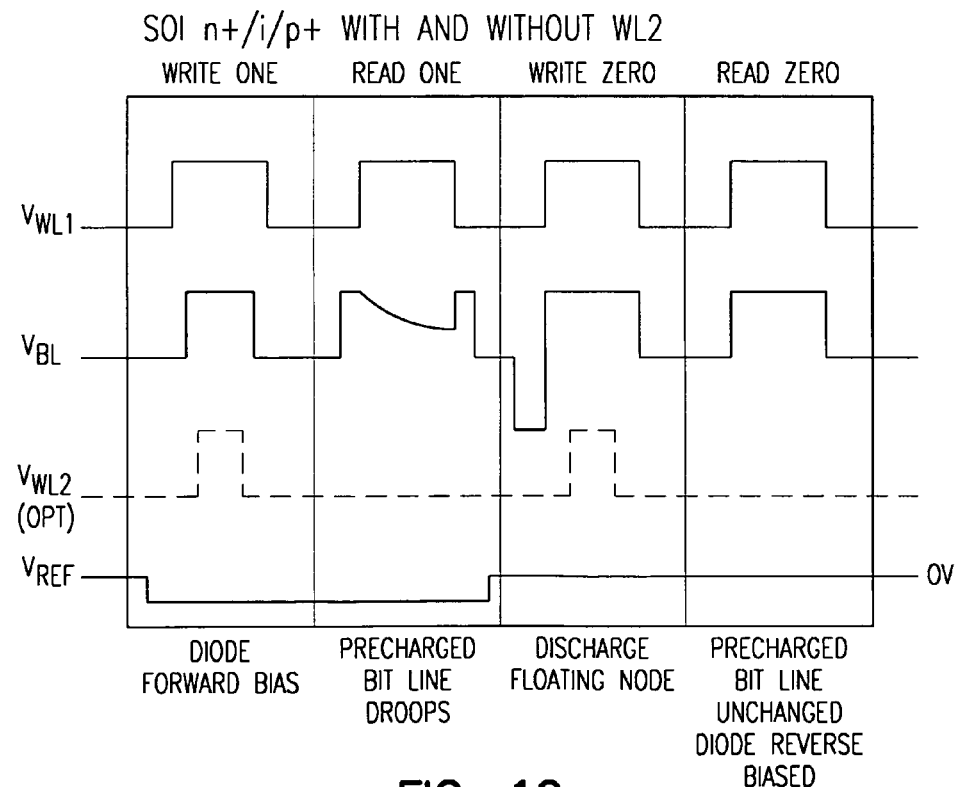
FIG. 19 illustrates read/write operations for a CED-RAM with an n+/i/p diode such as for the VCED-RAM cells of FIGS. 13 and 15 and the LCED-RAM cells of FIGS. 16 and 18, according to various embodiments of the present invention.

FIG. 19 illustrates read/write operations for a CED-RAM with an n+/i/p diode such as for the VCED-RAM cells of FIGS. 13 and 15 and the LCED-RAM cells of FIGS. 16 and 18, according to various embodiments of the present invention. In various embodiments, the steady state (SS) reference potential ($V_{REF}$) for the diode is set around 0 to +0.5 V to reduce diode leakage and standby current. This is also true during write-zero and read-zero operation. However, during write-one and read-one operations, the reference potential is set to approximately −0.8 V for forward biasing the diode. In various embodiments, $V_{WL}$ is set to the power supply voltage (e.g. 2.0 or 2.5 volts).

A write-one operation involves pulsing the $V_{REF}$ negative to set the n/i/p diode in the forward mode followed by raising $V_{WL1}$ and $V_{BL}$ as shown to operate the access transistor (NFET) in a saturation mode. Excess holes are generated in the floating body by impact ionization, which raises the substrate (p−) potential and the p+ diode potential to strongly switch the diode into the stable high conduction "on" state. With both the access transistor and the diode conducting, the N+ floating node potential is discharged. Thus, the memory cell is written into the "one" state.

For a write-zero operation, $V_{BL}$ is first pulsed negative to generate excess electrons in the substrate by turning on the p−/n+ diode junction (formed by the p− substrate and n+ bit line diffusion) first and thereafter raising the $V_{WL}$ or $V_{WL1}$. The generated electrons in the substrate recombine with the holes in the intrinsic region to increase the speed of the transition of the diode from the on state to the off state by neutralizing the saturation charges in the intrinsic region. The access transistor conducts when $V_{WL}$ is raised such that the potential in the floating node rises and reverse biases the diode. Thus the cell is written "zero" and is held by the presence of the intrinsic region.

In a read-one operation, the bit line is pre-charged to a high potential ($V_{BL}$) the diode conducts and the bit line potential drops when the word line is turned up and the access device conducts. In a read-zero operation, the word line potential is raised, the bit line is pre-charged up and the reference potential is held in standby. No charge flows through the access device, and the bit line remains unchanged and high and the cell is read "zero." For device option, which uses the second word line as in FIG. 15, the second word line potential ($V_{WL2}$), shown as an optional using a dotted line, is raised during write-zero and write-one operations as shown which further enhances cell performance.

B2. CED-RAM with P/I/N Diode

A charge-enhanced diode random access memory (CED-RAM) cell that includes a p/i/n diode is discussed within this section. The p/i/n diode has a p-type anode and an n-type cathode. The majority carrier for the p/i/n diode is holes, which are less mobile than electrons. However, the p/i/n diodes are easier to fabricate with the n+ floating node of the n-channel access transistor. A cell structure with a vertical p/i/n diode is discussed in Section B2(a), a cell structure with a lateral p/i/n diode is discussed in Section B2(b), and cell operations for a GCD-RAM with a p/i/n diode is discussed in Section B2(c).

B2 (a). VCED-RAM with P/I/N Diode

Figure 20:
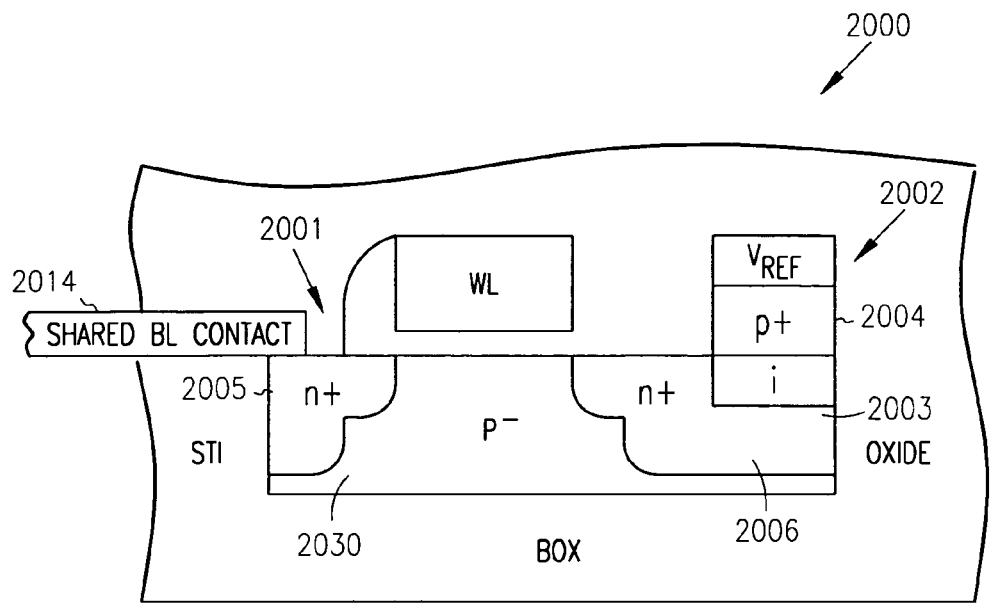
FIG. 20 illustrates a vertical charge-enhanced diode random access memory (VCED-RAM) cell with a p+/i/n+ diode, according to various embodiments of the present invention.

FIG. 20 illustrates a vertical charge-enhanced diode random access memory (VCED-RAM) cell with a p+/i/n+ diode, according to various embodiments of the present invention. In the illustrated embodiment of the memory cell 2000, the p+/i/n+ diode is vertically formed such that at least a portion of the diode is within the floating body of the access device. The illustrated memory cell 2000 is formed in a semiconductor volume 2030 over a buried oxide (BOX) region. In various embodiments, the depth to the BOX region is approximately 100 nm in 0.1 micron lithography. In the illustrated embodiment, the semiconductor volume include p− silicon.

The illustrated first and second diffusion regions 2005 and 2006 are formed by implanting n-type dopants. The bit line contact 2014 is formed in contact with the first diffusion region 2005, and the second diffusion region 2006 forms a floating storage node for the access transistor 2001. A p+/i/n+ diode 2002 is vertically formed such that the n+ cathode 2003 of the diode 2002 is integrally formed with the second diffusion region 2006. A p+ anode 2004 is formed over the diffusion region 2006 separated by an intrinsic region. In various embodiments, the intrinsic region is formed either by starting with an intrinsic silicon substrate or by careful dopant compensation between the n+ cathode region 2003 and the p+ anode region 2004. A $V_{REF}$ contact 2031 is formed to contact the p+ anode 2004 of the vertical diode 2002, which could be a metal silicide. In various embodiments, the VCED-RAM cell is formed using selective epitaxy and raised source/drain technology, as discussed above. Considerations related to the intrinsic region of the diode are similar for the cells discussed in the previous cases. Fabrication and layout considerations are also similar.

Figure 21:
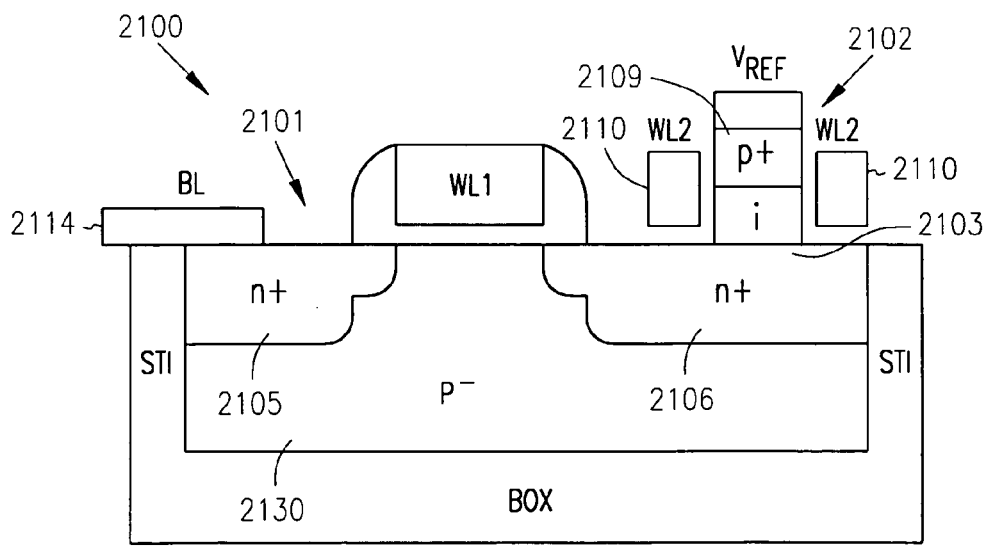
FIG. 21 illustrates a gate-controlled vertical charge-enhanced diode random access memory (VCED-RAM) cell with a p+/i/n+ diode, according to various embodiments of the present invention.

FIG. 21 illustrates a gate-controlled vertical charge-enhanced diode random access memory (VCED-RAM) cell with a p+/i/n+ diode, according to various embodiments of the present invention. The illustrated memory cell 2100 is formed in a semiconductor volume 2130 over a buried oxide (BOX) region. In various embodiments, the depth to the BOX region is approximately 100 nm in 0.1 micron lithography. In the illustrated embodiment, the semiconductor volume include p− silicon.

The illustrated first and second diffusion regions 2105 and 2106 are formed by implanting n-type dopants. The bit line contact 2114 is formed in contact with the first diffusion region 2105, and the second diffusion region 2106 forms a floating node for the access transistor 2101. A p+/i/n+ diode 2102 is vertically formed on the second diffusion region 2106 using selective epitaxy and raised source/drain technology. The n+ cathode 2103 of the diode 2102 is integrated with the n+ floating node 2106 of the transistor 2101. A $V_{REF}$ contact 2131 is formed to contact the p+ anode 2104 of the diode 2102. In various embodiments, the diode 2102 is gate-controlled, as illustrated by the second word line (WL2) that surrounds the diode pillar and functions as diode gate 2110. Thus, various SOI embodiments use gate-controlled diodes in place of or in addition to a charge-enhanced implementation.

B2 (b). LCED-RAM with P/I/N Diode

Figure 22:
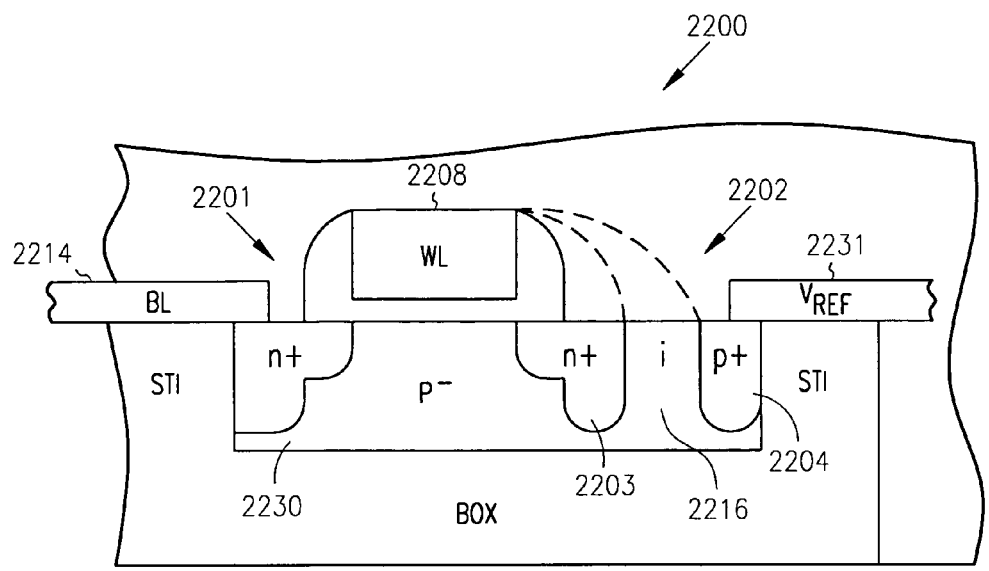
FIG. 22 illustrates a planar lateral version of a charge-enhanced diode random access memory (LCED-RAM) cell with a p+/i/n+ diode, according to various embodiments of the present subject invention.

FIG. 22 illustrates a planar lateral version of a charge-enhanced diode random access memory (LCED-RAM) cell with a p+/i/n+ diode, according to various embodiments of the present subject invention. The illustrated memory cell 2200 is formed in a semiconductor volume 2230 over a buried oxide (BOX) region. In various embodiments, the depth to the BOX region is approximately 100 nm in 0.1 micron lithography. In the illustrated embodiment, the semiconductor volume include p− silicon. The p+/i/n+ diode 2202 is placed within the floating body of the access transistor 2201. The figures illustrate contacts for bit line 2214, word line 2208 and the diode reference potential line 2231. In various embodiments, both the bit line contact as well as the diode contact are shared with adjacent cells in opposite ends to improve cell density similar to the bulk memory devices. In various embodiments, the LCED-RAM cell is fabricated using standard SOI-CMOS technology. The intrinsic region 2216 of the diode is defined by lithography and lateral diffusion of the n+ and p+ diffusion pockets 2203 and 2204 (which functions as the cathode and anode) of the diode for the LCED-RAM cell. In various embodiments, the cell is fabricated using an intrinsic SOI wafer as a starting material and subsequently doping the substrate appropriately.

The memory cell illustrated in FIG. 22 is very dense, and is capable of being fabricated using a relatively simple process, including a selective spacer process (represented by the dotted lines). The formation of the intrinsic region 2216 using the selective spacer process depends on the spacer geometry, the doping levels of the n-type dopant pocket and the p-type dopant pocket, and the thermal budget for thermal diffusion and recombination of the n-type and p-type dopants. Considerations related to the intrinsic region of the diode are similar for the cells discussed in the previous cases. Fabrication and layout considerations are also similar.

Figure 23:
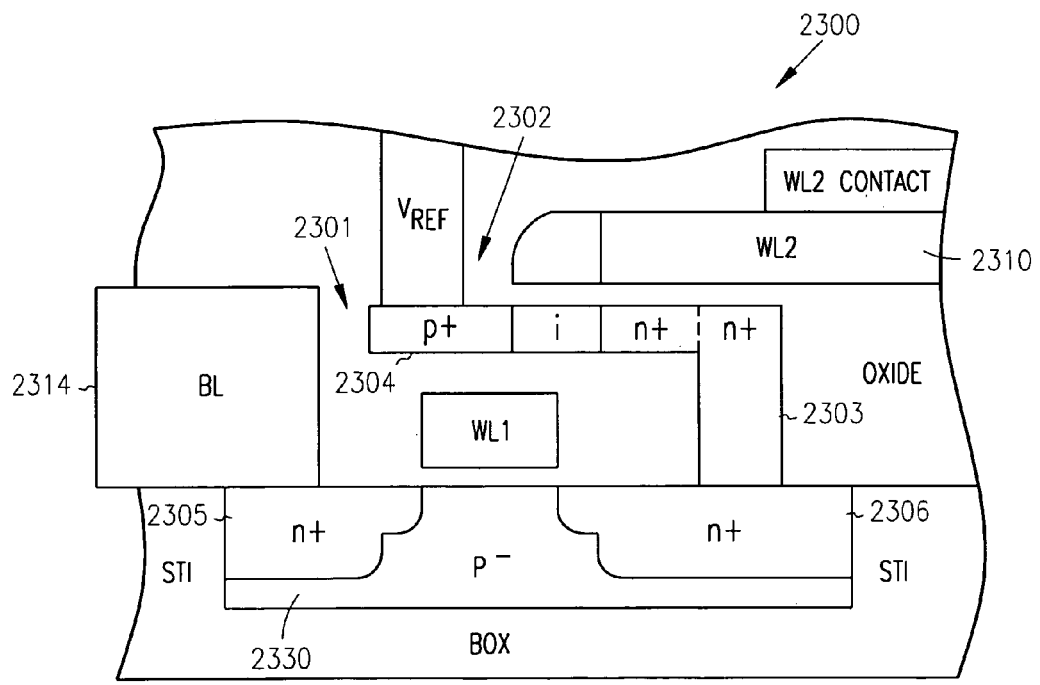
FIG. 23 illustrates a stacked lateral charge-enhanced diode random access memory (LCED-RAM) cell with a p+/i/n+ diode, according to various embodiments of the present subject invention.

FIG. 23 illustrates a stacked lateral charge-enhanced diode random access memory (LCED-RAM) cell with a p+/i/n+ diode, according to various embodiments of the present subject invention. The illustrated memory cell 2300 is formed in a semiconductor volume 2330 over a buried oxide (BOX) region. In various embodiments, the depth to the BOX region is approximately 100 nm in 0.1 micron lithography. In the illustrated embodiment, the semiconductor volume include p− silicon.

The illustrated first and second diffusion regions 2305 and 2306 are formed by implanting n-type dopants. The bit line contact 2314 is formed in contact with the first diffusion region 2305, and the second diffusion region 2306 forms a floating node for the access transistor 2301. A p+/i/n+ diode 1802 is laterally formed over the transistor 2301 and in contact with the second diffusion region 2306 using selective epitaxy and raised source/drain technology, and further using TFT and MILC technology as discussed previously. The n+ raised region functions as the cathode 2303 of the diode 2302 and is integrated with the n+ floating node 2306 of the transistor 2301. A $V_{REF}$ contact 2331 is formed to contact the p+ anode 2304 of the lateral diode 2302. In various embodiments, the diode is gate-controlled, as illustrated by the second word line (WL2) that functions as the diode gate 2310. Thus, as illustrated here, various SOI embodiments use gate-controlled diodes in place of or in addition to a charge-enhanced implementation.

B2 (c). Operation of CED-RAM with P/I/N Diode

Figure 24:
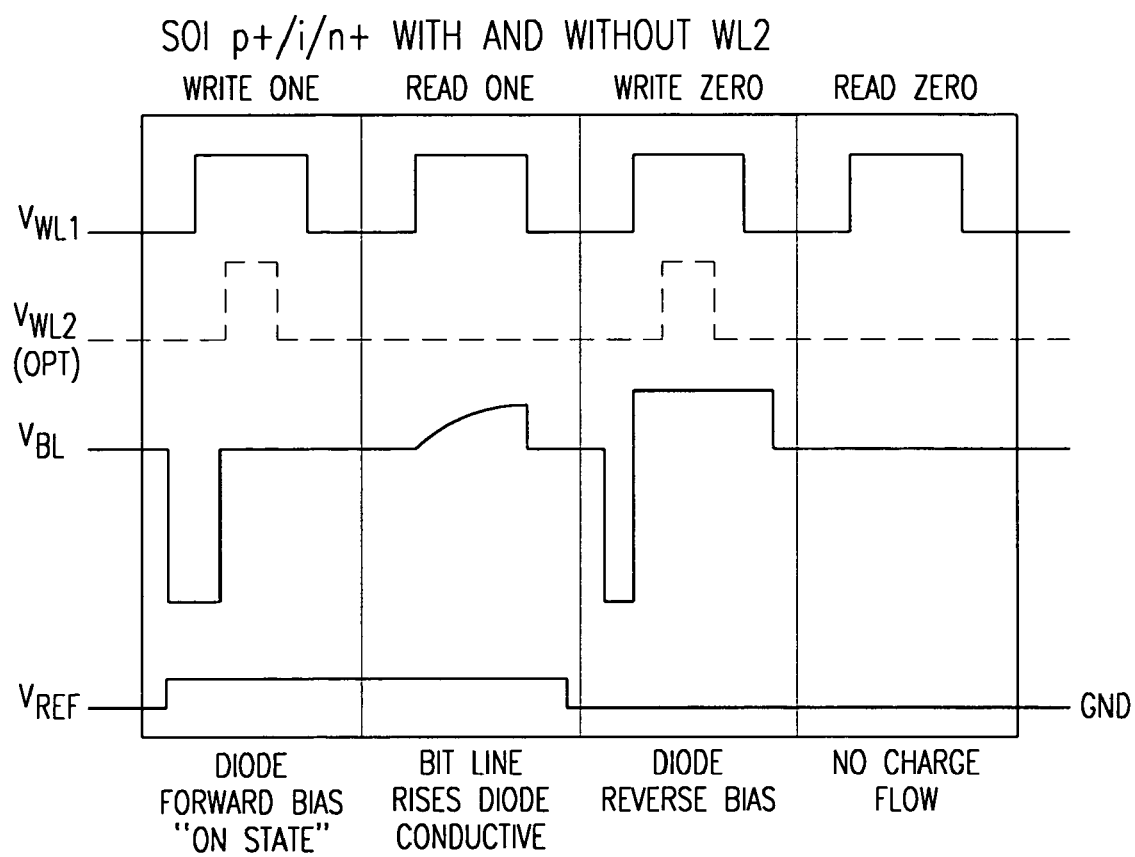
FIG. 24 illustrates read/write operations for a CED-RAM with a p+/i/n+ diode such as for the VCED-RAM cells of FIGS. 20-21 and the LCED-RAM cells of FIG. 22-23 without the second word line WL2, according to various embodiments of the present invention.

FIG. 24 illustrates read/write operations for a CED-RAM with a p+/i/n+ diode such as for the VCED-RAM cells of FIGS. 20-21 and the LCED-RAM cells of FIGS. 22-23, according to various embodiments of the present invention. An optional second word line WL2, which gate controls the diode to further enhance performance, is illustrated using a dotted line. It is noted that the timing diagram is not limited to a particular time scale, and as such can be used to illustrate timing with and without the second word line WL2.

Cell operations are somewhat complimentary to the cases discussed above for the CED-RAM with a n/i/p diode. In various embodiments, the reference potential ($V_{REF}$) for the diode is set high for write and read "one" but otherwise held to ground to reduce leakage. In various embodiments, the word line potential ($V_{WL}$) is set to the power supply potential similar to the earlier cases. Write-one operations involve forward biasing the p+/i/n diode by raising the reference potential, initially pulsing $V_{BL}$ negative for a short duration to inject electrons in the body, thereby strongly setting the p+/i/n diode into high conduction mode. Subsequently, the access transistor is turned on, the floating node is discharged and the cell is written "one." To read "one," the word line is turned on, turning the access transistor on while the diode is conducting. The flow of charge from the diode is sensed by the rise of potential in the bit line as shown. Write-zero operations involve initially providing a short negative $V_{BL}$ pulse, and then raising both $V_{WL}$ and $V_{BL}$ while the reference potential is held to ground. Excess electrons thus generated recombine with holes in the intrinsic region to enhance the on-to-off transition of the diode. Subsequently, the access transistor conducts and the floating node potential rises to $V_{BL}-V_{REF}$. Thus, the cell writes "zero" while the diode remains reverse-biased. In a read-zero operation, $V_{WL}$ is raised, $V_{REF}$ is held to ground, and $V_{BL}$ stays low and unchanged when read.

B3. CED-RAM Process

The above-discussed CED-RAM cell embodiments include VCED-RAM cells (memory cells with vertical p+/i/n+ diodes and memory cells with vertical n+/i/p diodes), and further include LCED-RAM cells (memory cells with lateral p+/i/n+ diodes and memory cells with lateral n+/i/p diodes).

B3(a). VCED-RAM Process

In various embodiments, these devices are fabricated using standard SOI silicon CMOS technology by following the process sequence similar to the one outlined above for VGCD-RAM cell.

B3(b). LCED-RAM Process

In various embodiments, these devices are fabricated using standard SOI silicon CMOS technology. To control the lateral width of the intrinsic region for the diode precisely, a first sacrificial side-wall gate (poly-silicon word line) spacer is used to define the anode n+ region (for the n+/i/p+ diode) or the p+ region (for p+/i/n diode) followed by an appropriate ion implant. Subsequently, a segment of the spacer is selectively removed at the gate edge while protecting the remaining active region to define and implant the cathode pocket (p or p+ for the n+/i/p+ diode, n or n+ for p+/i/n diode) for the diode. The sacrificial spacer, for example, may consist of nitride and oxide whereby nitride interfacing the poly-silicon gate could be selectively removed to define the cathode pocket of the diode. Other appropriate material or technique could also be used to define and control the lateral geometry for the diode pocket and intrinsic regions. The remaining device fabrication processes could be conventional.

System Level

Figure 25:
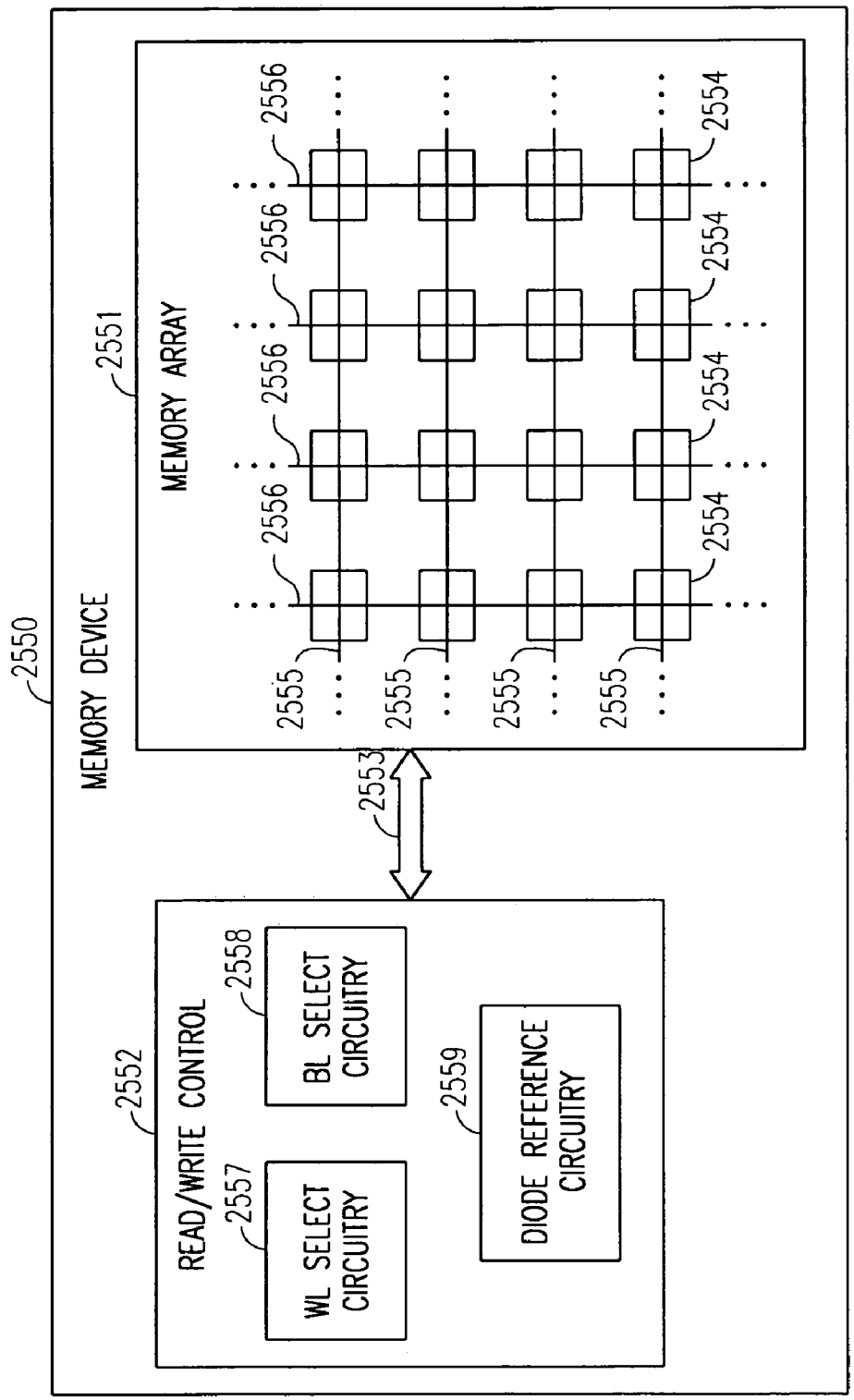
FIG. 25 is a simplified block diagram of a high-level organization of various embodiments of a memory device according to various embodiments of the present invention.

FIG. 25 is a simplified block diagram of a high-level organization of various embodiments of a memory device according to various embodiments of the present invention. The illustrated memory device 2550 includes a memory array 2551 and read/write control circuitry 2552 to perform operations on the memory array via communication line(s) 2553. The illustrated memory device 2550 may be a memory card or a memory module such as a single inline memory module (SIMM) and dual inline memory module (DIMM).

The memory array 2551 includes a number of memory cells 2554. The memory cells in the array are arranged in rows and columns. In various embodiments, word lines 2555 connect the memory cells in the rows, and bit lines 2556 connect the memory cells in the columns. The read/write control circuitry 2552 includes word line select circuitry 2557, which functions to select a desired row. In various embodiments disclosed herein, the word line select circuitry 2557 control a first word line WL1 to gate an access transistor, and a second word line WL2 to gate a diode. The read/write control circuitry 2552 further includes bit line select circuitry 2558, which functions to select a desired column. In various embodiments, the read/write control circuitry 2552 includes diode reference circuitry 2559, which functions to control a reference potential ($V_{REF}$) applied to the diode.

Figure 26:
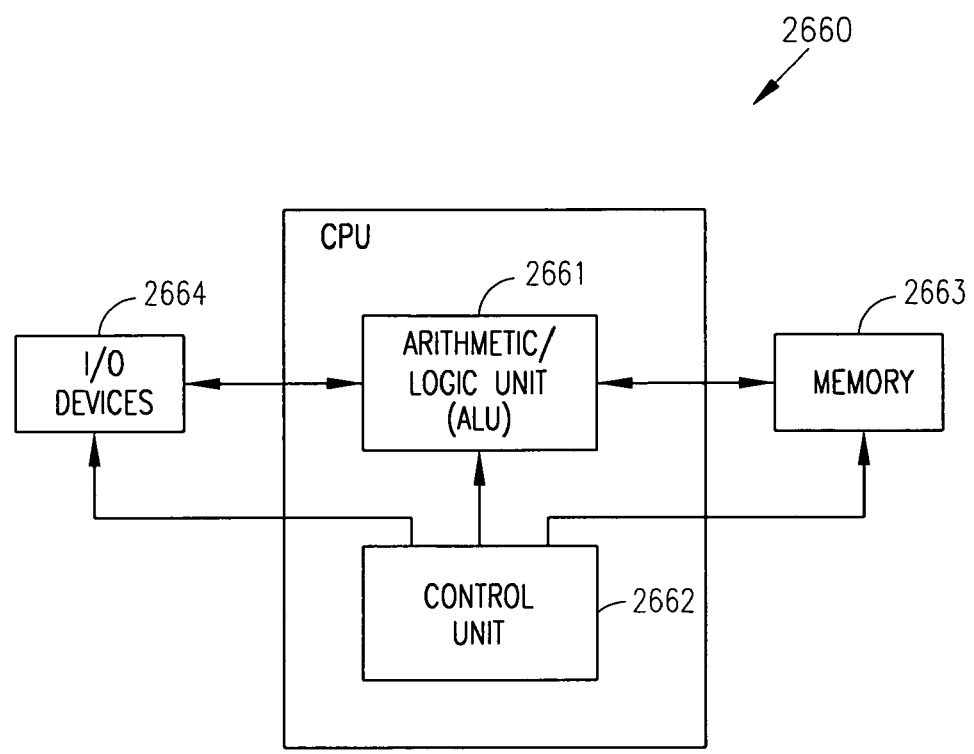
FIG. 26 is a simplified block diagram of a high-level organization of various embodiments of an electronic system according to the present invention.

FIG. 26 is a simplified block diagram of a high-level organization of various embodiments of an electronic system according to the present invention. In various embodiments, the system 2660 is a computer system, a process control system or other system that employs a processor and associated memory. The electronic system 2660 has functional elements, including a processor or arithmetic/logic unit (ALU) 2661, a control unit 2662, a memory device unit 2663 (such as illustrated in FIG. 25) and an input/output (I/O) device 2664. Generally such an electronic system 2660 will have a native set of instructions that specify operations to be performed on data by the processor 2661 and other interactions between the processor 2661, the memory device unit 2663 and the I/O devices 2664. The control unit 2662 coordinates all operations of the processor 2661, the memory device 2663 and the I/O devices 2664 by continuously cycling through a set of operations that cause instructions to be fetched from the memory device 2663 and executed. According to various embodiments, the memory device 2663 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include random access memory cells in accordance with various embodiments of the present invention.

The illustration of the system 2660 is intended to provide a general understanding of one application for the structure and circuitry, and is not intended to serve as a complete description of all the elements and features of an electronic system according to the various embodiments of the present invention. As one of ordinary skill in the art will understand, such an electronic system can be fabricated in single-package processing units, or even on a single semiconductor chip, in order to reduce the communication time between the processor and the memory device.

Applications containing memory cells as described in this disclosure include electronic systems for use in memory modules, device drivers, power modules, communication modems, processor modules, and application-specific modules, and may include multilayer, multichip modules. Such circuitry can further be a subcomponent of a variety of electronic systems.

CONCLUSION

Various embodiments disclosed herein provide a high-performance one-transistor memory cell. The memory cell includes an access transistor. A gate of the access transistor is connected to a word line, a first diffusion region of the access transistor is connected to a bit line, and a second diffusion region of the access transistor forms a floating node. The memory cell includes a diode connected between a reference potential line and the floating node. The diode includes an anode, a cathode, and an intrinsic region between the anode and cathode. The intrinsic region holds a charge associated with a binary state of the memory device. When the diode is forward biased, the floating node assumes low potential (write one). When the diode is reversed biased, the node potential is high and the charges are held across the intrinsic region. Various embodiments are implemented in bulk semiconductor substrate, and various embodiments are implemented in SOI substrates. In SOI implementations, various embodiments charges in a floating body of the access transistor are used to enhance the performance of the memory. These embodiments are referred to herein as Charge-Enhanced Diode Random Access Memory (CED-RAM) cells. Various embodiments of the memory cell gate the diode to further control the performance of the memory. These embodiments are referred to herein as Gate-Controlled Diode Random Access Memory (GCD-RAM) cells. Various embodiments of the memory cell of the present invention provide DRAM-like density, faster SRAM-like performance, and improved scalability.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A method for forming a memory cell, comprising:
    forming an access transistor with a floating node, the floating node to store a charge indicative of a memory state of the memory cell; and
    forming a Negative Differential Resistance (NDR) diode connected between the floating node and a reference potential line, wherein forming the NDR diode includes forming the diode with an intrinsic region between a cathode and an anode of the diode, the intrinsic region having a desired geometry to assist with stabilizing the memory state of the memory cell, wherein the cathode includes a cathode diffusion region in contact with the intrinsic region and the anode includes an anode diffusion region in contact with the intrinsic region.

2. The method of claim 1, wherein forming a diode with an intrinsic region between a cathode and an anode of the diode includes forming a diode with an intrinsic region between a p-type anode connected to the reference potential line and an n-type cathode connected to the floating node of the access transistor.

3. The method of claim 2, further comprising integrating the n-type cathode with an n-type diffusion region that forms the floating node of the access transistor.

4. The method of claim 2, further comprising forming the n-type cathode to interface with a p-type diffusion region that forms the floating node of the access transistor.

5. The method of claim 1, wherein forming a diode with an intrinsic region between a cathode and an anode of the diode includes forming a diode with an intrinsic region between an n-type anode connected to the reference potential line and a p-type cathode connected to the floating node of the access transistor.

6. The method of claim 5, further comprising integrating the p-type cathode with a p-type diffusion region that forms the floating node of the access transistor.

7. The method of claim 5, further comprising forming the p-type cathode to interface with an n-type diffusion region that forms the floating node of the access transistor.

8. The method of claim 1, wherein forming an access transistor with a floating node includes forming a p-channel access transistor.

9. The method of claim 1, wherein forming an access transistor with a floating node includes forming an n-channel access transistor.

10. The method of claim 1, wherein forming an access transistor with a floating node includes forming an access transistor in a bulk semiconductor substrate.

11. The method of claim 1, wherein forming an access transistor with a floating node includes forming an access transistor in a semiconductor-on-insulator (SOI) substrate.

12. The method of claim 1, wherein forming a diode connected between the floating node and a reference potential line includes forming a vertically-oriented diode.

13. The method of claim 12, wherein forming an access transistor with a floating node includes forming the access transistor in a semiconductor volume over a buried oxide region, and forming the vertically-oriented diode includes forming the diode in the semiconductor volume over the BOX region.

14. The method of claim 1, wherein forming a diode connected between the floating node and a reference potential line includes forming a laterally-oriented diode.

15. The method of claim 14, wherein forming an access transistor with a floating node includes forming the access transistor in a semiconductor volume over a buried oxide region, and forming the laterally-oriented diode includes forming the diode in the semiconductor volume over the BOX region.

16. The method of claim 14, wherein forming the laterally-oriented diode includes forming a raised floating node using a raised source-drain technology, and forming a crystalline lateral structure in contact with the raised floating node using a metal-induced-lateral-crystallization process.

17. A method for forming a memory cell, comprising:
forming an access transistor in a bulk semiconductor structure, including forming a first diffusion region separated from a second diffusion region by a channel region, and forming a gate separated from the channel region by a gate insulator;
forming a gate-controlled Negative Differential Resistance (NDR) diode, including forming an anode, a cathode, an intrinsic region positioned between the anode and the cathode, and forming a diode gate operably positioned with respect to the intrinsic region, wherein the cathode includes a cathode diffusion region in contact with the intrinsic region and the anode includes an anode diffusion region in contact with the intrinsic region;
connecting the diode between a reference potential line and the second diffusion region;
connecting the first diffusion region to a bit line;
connecting the gate to a first word line; and
connecting the diode gate being to a second word line.

18. The method of claim 17, wherein forming the gate-controlled diode includes forming a laterally-oriented diode over the access transistor.

19. The method of claim 18, wherein forming the laterally-oriented diode includes performing a metal-induced crystallization process.

20. The method of claim 17, wherein forming the gate-controlled diode includes forming a vertically-oriented diode.

21. A method for forming a memory cell, comprising:
forming a semiconductor-on-insulator (SOI) access transistor including forming a first diffusion region separated from a second diffusion region by a channel region, and forming a gate separated from the channel region by a gate insulator;
forming a Negative Differential Resistance (NDR) diode, including forming an anode, a cathode, and an intrinsic region between the anode and the cathode, wherein the cathode includes a cathode diffusion region in contact with the intrinsic region and the anode includes an anode diffusion region in contact with the intrinsic region;
connecting the diode between a reference potential line and the second diffusion region;
connecting the first diffusion region to a bit line; and
connecting the gate to a first word line.

22. The method of claim 21, further comprising forming a diode gate operably positioned with respect to the intrinsic region, and connecting the diode gate to a second word line.

23. The method of claim 21, wherein forming the diode includes forming a lateral-oriented diode.

24. The method of claim 21, wherein forming the diode includes forming a vertical-oriented diode.

* * * * *